(12) United States Patent
Hashimoto et al.

(10) Patent No.: US 7,369,926 B2
(45) Date of Patent: May 6, 2008

(54) ON-VEHICLE ELECTRONIC CONTROL UNIT

(75) Inventors: Kohji Hashimoto, Tokyo (JP); Shoso Tsunekazu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 455 days.

(21) Appl. No.: 11/042,506

(22) Filed: Jan. 26, 2005

(65) Prior Publication Data

US 2006/0047374 A1    Mar. 2, 2006

(30) Foreign Application Priority Data

Aug. 31, 2004   (JP)   .............................. 2004-252097

(51) Int. Cl.
*G06F 19/00*    (2006.01)

(52) U.S. Cl. ............................................ 701/36; 701/1

(58) Field of Classification Search .................... 701/1, 701/36; 711/103, 147, 165
See application file for complete search history.

(56) References Cited

U.S. PATENT DOCUMENTS

| 6,141,726 | A | 10/2000 | Dell |
| 6,640,259 | B2 * | 10/2003 | Nakamoto et al. .............. 710/5 |
| 6,708,089 | B2 * | 3/2004 | Hashimoto et al. ............. 701/1 |
| 6,915,192 | B2 * | 7/2005 | Hashimoto et al. ............ 701/35 |
| 2002/0169524 | A1 * | 11/2002 | Nakamoto et al. .............. 701/1 |
| 2005/0276114 | A1 * | 12/2005 | Tsunekazu et al. ....... 365/185.22 |

FOREIGN PATENT DOCUMENTS

| DE | 197 37 182 A1 | 3/1999 |
| JP | 07-302231 | 11/1995 |
| JP | 9-244707 A | 9/1997 |
| JP | 9-259046 A | 10/1997 |
| JP | 2000-045858 | 2/2000 |
| JP | 2001-182607 A | 7/2001 |
| JP | 2002-007221 | 1/2002 |
| JP | 2004-218614 | 8/2004 |
| WO | WO 2004/021191 A1 | 3/2004 |

* cited by examiner

*Primary Examiner*—Gary Chin
(74) *Attorney, Agent, or Firm*—Sughrue Mion, PLLC

(57) ABSTRACT

A microprocessor of an on-vehicle electronic control unit controls an on-vehicle current consumer group responsive to input signals of on-vehicle sensor groups based on control program, fixed control constant and semi-fixed control constant respectively stored in first block of a no-volatile memory, and variable control constant having been transferred from second block of the no-volatile memory to RAM memory; and content of RAM memory is learned and compensated during operation. When power supply switch is OFF, contents of the RAM memory are sequentially added to and written in the second block. When the second block is filled up to capacity, batch clear is executed and, thereafter, the latest data is written. Thus, a flash memory divided into the first and second blocks capable of executing batch clear separately is employed as a non-volatile memory, enabling to perform save processing many times with small number of times of batch clear.

19 Claims, 9 Drawing Sheets

ON-VEHICLE ELECTRONIC CONTROL UNIT

BACKGROUND OF THE INVENTION

1. Field of the Invention

The present invention relates to an on-vehicle electronic control unit that carries out, for example, fuel supply control of an automobile engine, open/close control of an air supply throttle valve or control of a transmission and, more particularly, to an on-vehicle electronic control unit being arranged so as to improve power failure hold control of a RAM memory in which a variety of learning data calculated by a microprocessor, so as to make use of a part of flash memory used as a program memory of the microprocessor as a non-volatile data memory, and to increase the number of times of rewriting this data memory.

2. Description of the Related Art

Generally, an conventional on-vehicle electronic control unit is formed of a program memory in which control programs and control constants for a controlled vehicle type are stored from an external tool and of a microprocessor provided with an operation processing RAM memory. The conventional on-vehicle electronic control unit is fed with an electric power from an on-vehicle battery when a power supply switch is brought in a closed circuit to control an on-vehicle current consumer group in response to input signals from on-vehicle sensor groups, a content of the mentioned program memory, and a content of control constants having been transferred from the mentioned program memory to the RAM memory. In this conventional on-vehicle electronic control unit, a part of control constants in the mentioned RAM memory is processed as variable control constants to be rewritten and altered as a learning compensation result. Accordingly, the following arts have been widely put into practical use. That is, this conventional on-vehicle electronic control unit is provided with a non-volatile data memory such as EEPROM capable of being electrically written, and various learning data, vehicle inherent information, analysis and maintenance information or the like are written in this data memory and utilized as effective driving control information or diagnosis information by the external tools.

For example, it is described in "On-Vehicle Control Unit" disclosed in the Japanese Patent Publication (unexamined) No, 182607/2001 that an object of the invention is to eliminate influences due to change with the passage of time or individual difference in control targets. To accomplish the object, a microprocessor cooperating with a mask ROM, in which control programs are stored, copes with the interruption of battery wiring or the abnormal decrease of battery voltage by estimating control results in the past (control history) to calculate a learning data for correction of a control parameter or a control theory and by transferring this learning data from the RAM memory to the non-volatile EEPROM memory. Especially, this prior art describes about improvement against the possibility that a power supply switch is accidentally interrupted on the way of the learned data being saved and written from the RAM memory to the EEPROM memory.

On the other hand, instead of the mentioned non-volatile EEPROM memory, the use of a mass storage of non-volatile flash memory is carried out, in which data can be written after batch clear. For example, it is described in "Processing Unit" disclosed in the Japanese Patent Publication (unexamined) No. 244707/1997 that, in an engine control unit (ECU), a content of a RAM memory in which learning values are written is transferred and saved in a non-volatile flash memory every predetermined time period, thereby reducing the number of times of write in the flash memory.

Furthermore, according to "Data Storage Method to Flash Memory and Data Read Method from Flash Memory" disclosed in the Japanese Patent Publication (unexamined) No. 259046/1997, the following data storage method to a flash memory and data read method from a flash memory are proposed. In the methods, a region plural times as large as a record functioning as a minimum unit of write is batch clear, and thereafter data are sequentially written in this region for each record at the time of writing a predetermined amount of data, thus providing a method capable of reducing the number of times of erase and achieving longer operation life of the memory.

In the mentioned known arts, in the case of the Japanese Patent Publication (unexamined) No. 182607/2001, an EEPROM memory is employed as a non-volatile data memory, and in this EEPROM memory data can be freely written with a unit of 1 byte, and available number of times of rewriting can be relatively large through the operation life of the EEPROM memory. However, a problem exists in a small capacity of memory, thus coming high in cost.

Whereas, as for a flash memory disclosed in the Japanese Patent Publication (unexamined) No. 244707/1997, it is certain that a larger capacity of memory is achieved. However, this flash memory is a memory coming to be writable after batch clear has been executed. Although a memory capacity is large and designed to diminish the number of times of write, a problem still exists in a smaller number of times capable of executing batch clear through the operation life.

It is certain that the Japanese Patent Publication (unexamined) No. 259046/1997 can solve a problem of operation life incidental to the Japanese Patent Publication (unexamined) No. 244707/1997. However, in the case of the Japanese Patent Publication (unexamined) No. 259046/1997, a program memory ROM, a RAM memory for operation processing, and a flash memory as a non-volatile data memory with respect to a microprocessor are used, and therefore it is essential to use three types of memories appropriately, thus remaining problems of being complicated, expensive, and large-scaled.

SUMMARY OF THE INVENTION

The present invention was made to solve the above-discussed problems, and has an object of providing an on-vehicle electronic control unit in which a non-volatile flash memory is employed to act as a program memory, and a part of the non-volatile flash memory is utilized as a data memory, and which is capable of rewriting a save data by a sufficient number of times within a limited number of times of batch clear in operation life.

An on-vehicle electronic control unit according to this invention, which is formed of a microprocessor provided with a non-volatile memory in which a control program and a control constant corresponding to an uncontrolled vehicle are stored from an external tool, and a RAM memory for operation processing. The on-vehicle electronic control unit control an on-vehicle current consumer group responsive to an input signal from on-vehicle sensor group and a content of the mentioned non-volatile memory, and in which at least a part of the mentioned control constants is transferred to the mentioned RAM memory and used as a variable control constant to be rewritten and altered as a result of learning operation during operation. The mentioned non-volatile memory employs a flash memory in which data can be written after batch clear in a block unit of a first block and a second block.

A control constant processing program formed of initial transfer write means, first and second transfer save means, update transfer write means and batch clear means, and an initial value data with respect to a semi-fixed control constant and a variable control constant are preliminarily stored from the mentioned external tool in the first block of the mentioned non-volatile memory, in addition to an input/output control program, a learning control program and a fixed control constant. Further, the semi-fixed control constant is added and stored after control operation, and a variable control constant is stored in the second block of the mentioned non-volatile memory.

The mentioned initial transfer write means is means that transfers the mentioned initial value data to the mentioned RAM memory at the start of control operation, and uses it as a control constant at the time when learning has not completed yet.

The mentioned first transfer save means is means that adds and stores a semi-fixed control constant having been learned and stored during the control operation and written in the mentioned RAM memory in a predetermined region of the mentioned first block.

The mentioned second transfer save means is means that sequentially adds and stores a variable control constant having been learned and stored during the control operation and actual operation and having been sequentially updated and written in the mentioned RAM memory while updating an address of the mentioned second block.

The mentioned update transfer write means are means that transfer to the mentioned RAM memory a semi-fixed control constant having been stored in the first block by the mentioned first transfer save means and the latest variable control constant having been stored in the second block by the mentioned second transfer save means, and use it as a control constant after learning has completed.

The mentioned batch clear means is means that execute batch clear before the next addition and write (additional write), in the state of an amount of variable control constants having been sequentially added and written in the mentioned second block reaching a predetermined value, and that erase an entire data having been written in the second block.

In addition, the first block of the mentioned flash memory corresponds to a region occupying a major part (e.g., not less than 99%) of flash memory, and allows a small number of times of batch clear, for example, about 100 times.

The second block of the mentioned flash memory corresponds to a region occupying a tiny part (e.g., not more than 1%) of flash memory, and is enforced so as to allow a relatively large number of times of batch clear. For example, about ten thousand times of batch clear can be made.

However, the number of times of rewrite of hold data actually required at the time of power failure mounts to substantially ten thousand times. To meet this requirement, it is arranged such that the second block is divided into 10 sections, and data intended to hold at the time of power failure are sequentially added, written, and saved in this second block. Further, when the second block is filled with the data up to full capacity, batch clear will be executed, and then new save will be started.

To increase the number of sections of the second block, it is necessary to reduce a data amount per section. Therefore, fixed control constants or semi-fixed control constants are stored in the first block, and only variable control constants that requires a large number of times of rewrite are stored in the second block. Such an appropriate distribution acts as important improvement means.

As a result, according to the on-vehicle electronic control unit of this invention, the non-volatile memory cooperating with the microprocessor is divided into a program memory region and a data memory region to be in shared use, whereby an advantage exists in that memory arrangement is simplified to be downsized and inexpensive.

Further, fixed control constants and semi-fixed control constants are also stored in the first block being a program memory region other than a control program, and variable control constants are stored in the second block being a data memory region. Thus, an advantage is such that a memory capacity of the second block is reduced, and the number of times allowing batch clear to be executed is increased only as to a small capacity of memory region, thereby enabling to obtain an inexpensive flash memory.

Furthermore, save data are written plural times in the second block while changing addresses, and then batch clear will be executed. Thus, the number of times allowing the rewrite as a whole is considerably increased.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
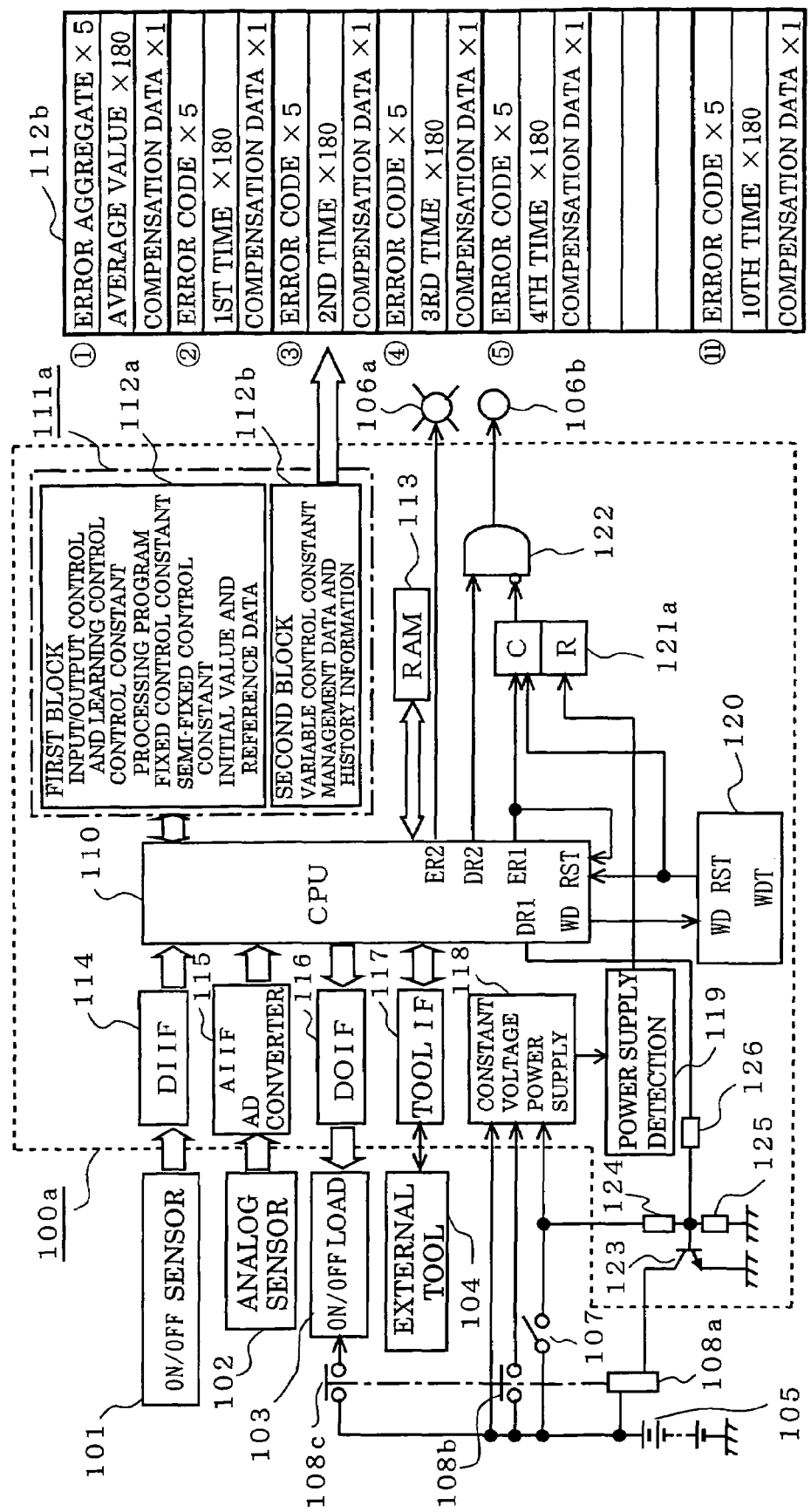
FIG. 1 is a block diagram showing an entire arrangement of an on-vehicle electronic control unit according to a first preferred embodiment.

Several preferred embodiments of the present invention are described with reference to the drawings.

In the drawings, like reference numerals indicate the same or like parts.

Embodiment 1

FIG. 1 is a block diagram showing an entire arrangement of an on-vehicle electronic control device according to a first embodiment of the invention.

With reference to FIG. 1, numeral 100a designates an on-vehicle electronic control unit according to the first embodiment that is made of a sheet of electronic board and accommodated in a sealed housing.

First, elements to be connected to the outside of the mentioned on-vehicle electronic control unit 100a are described.

Numeral 101 designates a non-vehicle sensor group for ON/OFF operation, for example, an engine rotation sensor, a crank angle sensor, and a vehicle speed sensor. Numeral 102 designates an analog on-vehicle sensor group, for example, an accelerator position sensor, a throttle position sensor, a water temperature sensor, an oxygen concentration sensor of exhaust gas, and an airflow sensor. Numeral 103 designates an on-vehicle current consumer group, for example, an ignition coil of engine, a fuel injection controlling solenoid valve, a valve opening control motor of air-supply throttle.

Numeral 104 designates an external tool. This external tool 104 is connected via a detachable connector, not shown, to the mentioned on-vehicle electronic control unit 100a at the time of product shipment or maintenance inspection, and transfers and writes control programs or control constants into a later-described non-volatile memory 111a, or reads out and inspects an internal state of the on-vehicle electronic control unit 100a.

Numeral 105 designates an on-vehicle battery. Numeral 107 designates a power supply switch such as ignition switch. Numeral 108a designates a power supply relay including output contacts 108b and 108c. Numeral 106a designates an error alarm/display. Numeral 106b designates a load power supply relay including an output contact not shown.

The mentioned power supply relay 108a is energized in cooperation with the operation of the mentioned power supply switch 107 from the mentioned on-vehicle battery 105. This power supply relay 108a closes a power supply circuit to the mentioned on-vehicle current consumer group 103 with the output contact 108c; and closes a power feed circuit from the mentioned on-vehicle battery 105 to the on-vehicle electronic control unit 100a with the output contact 108b.

In addition, the mentioned on-vehicle battery 105 and on-vehicle electronic control unit 100a are also provided with a direct connection circuit so as to be fed with an electric power in a sleep mode when the mentioned power supply switch 107 is in an open circuit.

Further, a part of on-vehicle current consumer group 103 is brought in a closed power supply circuit via an output contact of the mentioned load power supply relay 106b.

Now, an internal constitution of the mentioned on-vehicle electronic control unit 100a is described.

Numeral 110 designates a microprocessor of 32 bits. Numeral 111a designates a non-volatile memory, being a flash memory capable of making batch clear in a block unit. Numeral 112a designates a first block of this flash memory 110, and numeral 112b designates a second block. Numeral 113 designates a RAM memory for operation processing. Numeral 114 designates an input signal interface circuit that is connected to the mentioned on-vehicle sensor group 101, and is formed of a converter of signal voltage level, a noise filter, a data selector and the like. Numeral 115 designates an analog input interface circuit that is connected to the mentioned analog on-vehicle sensor group 102, and is formed of a noise filter, a multi-channel AD converter, a data selector and the like. Numeral 116 designates an output signal interface circuit that is connected to the mentioned on-vehicle current consumer group 103, and is formed of an output latch memory or a power transistor. Numeral 117 designates a tool interface circuit to be serial-connected to the mentioned external tool 104.

The mentioned non-volatile memory 111a, RAM memory 113, interface circuits 114 to 117 are bus-connected to the mentioned microprocessor.

Numeral 118 designates a constant voltage power supply. This constant voltage power supply 118 is directly fed with power from the mentioned on-vehicle battery 105, or fed with power via the mentioned power supply switch 107 or the output contact 108b of the power supply relay 108a; and generates a stabilized control power supply output to be used in the mentioned on-vehicle electronic control unit 100a.

Numeral 119 designates a power supply detection circuit. This power supply detection circuit 119 detects that the mentioned power supply switch 107 is brought in a closed circuit, provides a pulse output to a reset input R of a later-described count circuit 121a to initialize a count current value of this count circuit 121a to be 0, and clears an error storage output.

Numeral 120 designates a watchdog timer. This watchdog timer 120 monitors a watchdog signal WD, being a pulse train which the mentioned microprocessor 110 generates, and generates a reset signal output RST when a pulse width of this watchdog signal exceeds a predetermined value to restart the mentioned microprocessor 110.

Numeral 121a designates a count circuit provided with a count input C and a reset input R. This count circuit 121a generates an error storage output when the number of times that a logic level of the mentioned count input C changes from "L" to "H" is not less than a predetermined value. Further, an error output ER1, which the mentioned microprocessor 110 generates, and a reset signal output RST from the mentioned watchdog timer 120 is connected to act as count input to the count circuit 121a.

Numeral 122 designates a drive stop circuit formed of an AND circuit. A logic inverting input of error storage output from the mentioned count circuit 121a and a load power supply drive output DR2 from the mentioned microprocessor 110 are connected to the input of the drive stop circuit 122. The mentioned load power supply relay 106b is connected to the output of the drive stop circuit 122.

Additionally, the mentioned error alarm/display 106a is driven with an error output ER2, which the mentioned microprocessor 110 generates.

Numeral 123 designates a drive element connected to an electromagnetic coil of the mentioned power supply relay 108a. Numeral 124 designates a first drive resistor causing the mentioned drive element 123 to be conductive when the mentioned power supply switch 107 is brought in a closed circuit. Numeral 125 designates a ballast resistor connected between the base/emitter terminals of the mentioned drive element 123 being a transistor. Numeral 126 designates a second drive resistor causing the mentioned drive element 123 to be conductive with a drive output DR1 which the mentioned microprocessor 110 generates.

When the mentioned power supply switch 107 has once been brought in a closed circuit, and the power supply relay 108a starts operation, the microprocessor 110a comes to operate, thereby the mentioned drive output DR1 being generated. Thereafter, even if the power supply switch 107 is brought in an open circuit, the operation of the power supply relay 108a can continue to be held until the output of a drive output DR1 is stopped.

In addition, it is arranged such that even if the power supply relay 108a is energized, the load power supply relay 106b is de-energized, thereby enabling to stop power feed to apart of on-vehicle current consumers that may give an important influence on safe traveling of a vehicle, for example, an open/close driving motor of an inlet throttle valve.

Now, action and operation of the on-vehicle electronic control unit according to the first embodiment shown in FIG. 1 are described.

With reference to FIG. 1, the microprocessor 110 controls operations of the on-vehicle current consumer group 103 in accordance with an operation state of the on-vehicle sensor group 101 for ON/OFF operation, a signal level of the analog on-vehicle sensor group 102, and a content of the non-volatile memory 111a. In the non-volatile memory 111a, control programs or control constants have preliminarily been written from the external tool 104.

The non-volatile memory 111a is a flash memory including a memory capacity of, for example, 512 bytes as a whole. A capacity of memory is distributed so as to be 508K bytes for the first block 112a and 4K bytes for the second block 112b.

In the first block 112a, a later-described control constant processing program is stored in addition to an input/output control program or a learning control program.

In the first block 112a, a constant storage region is provided other than the mentioned program region. In this constant storage region, a fixed control constant, semi-fixed control constant, an initial value data and reference data are stored.

In the second block 112b, a variable control constant, a management data, and history information are stored.

A fixed control constant to be stored in the constant storage region of the mentioned first block 112a relates to a program inherent information, being an invariable design constant determined in association with the mentioned input/output control program.

A semi-fixed control constant to be stored in the constant storage region of the mentioned first block 112a is calibration value information for compensating the fluctuation of parts of, e.g., an output voltage accuracy of the constant voltage power supply 118 contained in the on-vehicle electronic control unit 100a, or a conversion accuracy of the AD converter, not shown, contained in the input interface circuit 115. This semi-fixed control constant relates to control unit inherent information that is not varied after it has once been stored as an initial measured value even though semi-fixed control constants are of different values in respective individual products.

In this first embodiment, as further semi-fixed control constants to be stored in the constant storage region of the mentioned first block 112a, there are environmental information such as vehicle type information for selecting and determining control specification of a vehicle on which the on-vehicle electronic control unit 100a is mounted, and characteristic accuracy information of an on-vehicle sensor externally connected to the on-vehicle electronic control unit 100a. These semi-fixed control constants are not changed until the replacement of parts externally connected after having once been stored as an initial value or an initial measured value even though the vehicle inherent information has individually different values depending upon respective vehicles on each of which the on-vehicle electronic control unit is mounted.

An initial value data to be stored in the constant storage region of the mentioned first block 112a is 0 (zero) or a specific constant value to be used as a virtual value at a pre-stage where initial measurement or learning operation with regard to the mentioned semi-fixed control constant or variable control constant is executed.

A reference data to be stored in the constant storage region of the mentioned first block 112a is a data showing a permissible variation width with respect to a permitted upper or lower limit value or a representative value relative to the mentioned semi-fixed control constant or variable control constant. In case of initial measurement error or learning operation result error, an average value, a representative value or the mentioned initial value is used as an estimated value.

In addition, supposing that the mentioned reference data is represented with the upper or lower limit values, e.g., from the minimum value 14.3 to the maximum value 16.3, an average value thereof, being 15.3 will be used as an estimated value.

Further, in the case where 15.0 (+1.3, −0.7), which is a representative value 15.0 and a permissible variation width (+1.3, −0.7) are specified as the mentioned reference data, the representative value 15.0 is used as an estimated value.

Although an initial value data can be utilized as it is as the mentioned representative value, it is ideal to take a predicted value changing over time that is different from an initial value data, as a representative value.

Furthermore, although an average value of the maximum and minimum values can be used as the mentioned initial value data, a reference data may be at least the one that defines the upper and lower limit values. In case of taking a fixed value permitting no variation, the upper and lower limit value will be the same value.

A variable control constant to be stored in the mentioned second block 112b is fluctuating information such as operation control information that is obtained as a result of actually measuring driving characteristics of a vehicle, or characteristic deterioration information of an on-vehicle sensor and current consumer. This variable control constant relates to learning storage information assumed to vary within a predetermined range at actual operation stage after it has once been stored as an initial value at the start of operation.

A management data to be stored in the mentioned second block 112b is the number of times of batch clear of the second block 112b and an average value of a number of variable control constants having been sequentially stored before batch clear.

A history management data to be stored in the mentioned second block 112b is an error history aggregate data obtained by aggregating by error code number the number of generations of error history having been sequentially stored before batch clear of the second block 112b.

The write region of the mentioned second block 112b is, for example, divided into 11 sections. In a unit region of one section, 186 points of data of which one data has 2 bytes of word length can be stored. Accordingly, a total of 186×2× 11=4092<4096 (4K bytes) bytes is used.

Out of 186 points of data, 180 points are allocated to various learning items, the remaining 5 points are allocated to codes by type of error occurrence, and the remaining 1 point is allocated to a later-described compensation data for sum check.

In the first region of the 11-piece write region, an average value of the last 10 times of 180 points of various learning items is stored as a management data.

Further, in this first region, the accumulated number of occurrence in the past with respect 5 types of error codes is stored as a history management data.

Furthermore, in the second region to the eleventh region of the 11-piece write region, 180 points of learning data and error code numbers having occurred are written.

All data in the mentioned first block have preliminarily been transferred and written from the external tool 104 except for semi-fixed control constants. These semi-fixed control constants are initially measured by the microprocessor 110 at the time of shipping inspection of the on-vehicle electronic control unit 100a or at the time of the first energization, after being actually mounted on a vehicle, and is transferred and written in a blank region of the first block 112a via the RAM memory 113.

Further, variable control constants in the second block 112b are subject to learning and operation by means of the microprocessor 110 during actual driving of a vehicle, and transferred and written from the RAM memory 113 while sequentially changing a write region of the second block 112b.

When the learning data are written up to the eleventh region, the entire second block 112b is brought in batch clear. A management data are written in the first region, and then a learning data having been newly generated are written in the second region.

When there is any error in additionally written data, e.g., a content of semi-fixed control constants in the first block 112a and a variable control constant content of the second block 112b, the error alarm/display 106a is operated with an error output ER2.

When there is an error in a basic region having been preliminarily written by the external tool 104, e.g., in a control program or a fixed control constant, an initial value, and a reference value of the first block 112a, then an error output ER1 is generated to cause the microprocessor 110 to reset and restart. Further, when the number of times of restart is counted at the count circuit 121a and the count value exceeds a predetermined value, the load power supply relay 106b is interrupted via the drive stop circuit 122.

The watchdog timer 120 monitors a watchdog signal WD, which the microprocessor 110 generates, and resets and restarts the microprocessor 110 in case of error occurrence in signal width. Further, the count circuit 121a aggregates and counts the error occurrence along with the mentioned error output ER1.

Even if the count circuit 121a counts up and the load power supply relay 106 is interrupted, a fuel injection solenoid valve or an ignition coil can operate, thereby enabling to carry out safe evacuation driving. In the case where error occurrence is duplicate occurrence of temporary noises, once interrupting and restarting the power supply switch 107, the count circuit 121a is reset by the power supply detection circuit 119, thus enabling the operation of the load power supply relay 106b to restore.

The second drive resistor 126 with respect to the drive element 123 functions to delay and interrupt the power feed to the on-vehicle electronic control unit 100a after the power supply switch 107 has been brought in an open circuit. In this delay period, measured values or learning information having been stored in the RAM memory 113 are written and saved in the non-volatile memory 111a.

Figure 2:
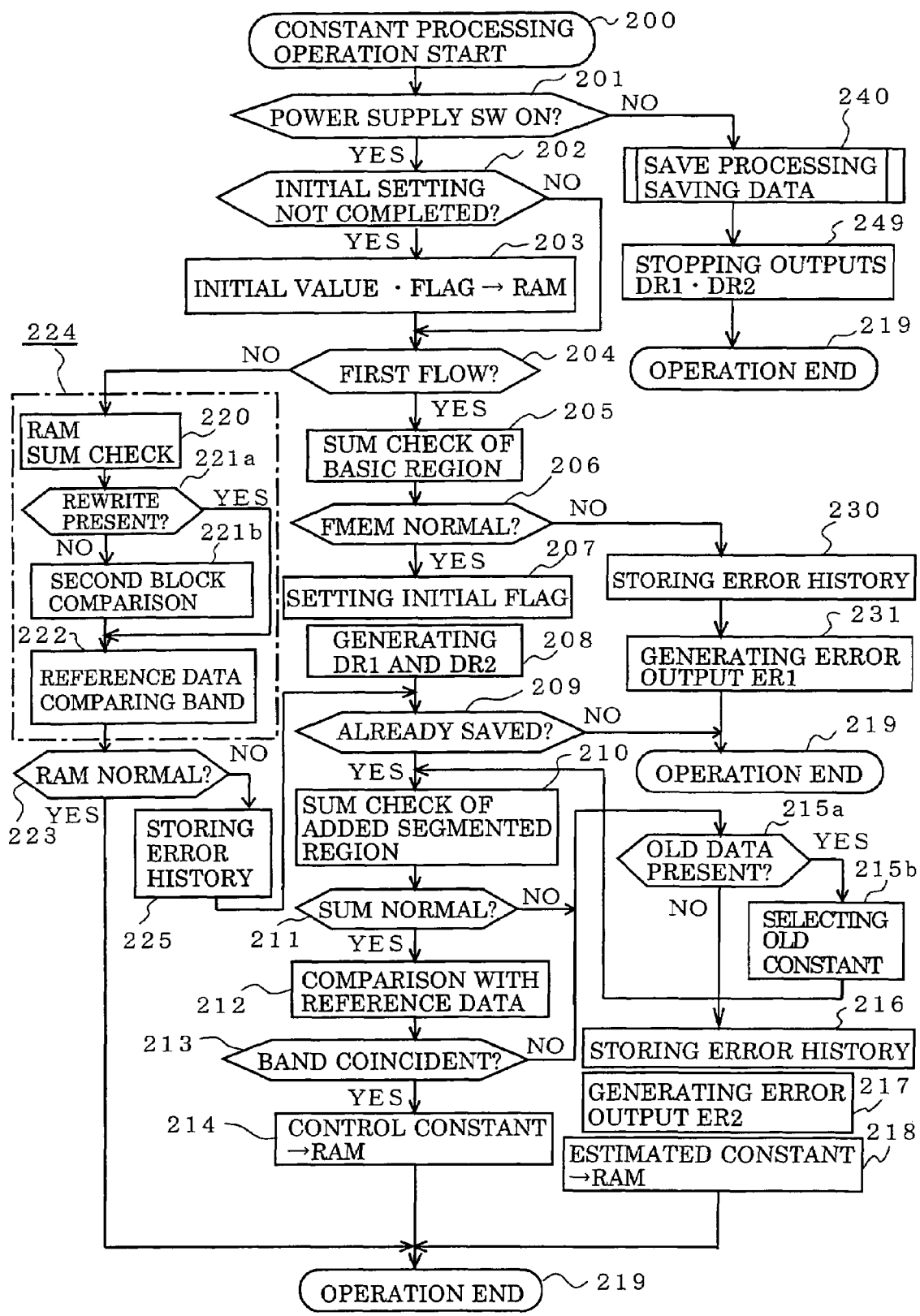
FIG. 2 is a flowchart for explaining operation of the on-vehicle electronic control unit according to the first embodiment.

Operations of the on-vehicle electronic control unit according to the first embodiment arranged as shown in FIG. 1 are now described referring to an explanatory flowchart of the operations shown in FIG. 2.

With reference to FIG. 2, numeral 200 is an operation start step of a control constant processing program by the microprocessor 110. Numeral 201 is a step that acts subsequently to the mentioned Step 200, and determines whether or not the power supply switch 107 is ON. Numeral 202 is a step that acts when the determination of the mentioned Step 201 is YES, and that determines whether or not initial setting has completed by monitoring a history flag, being one of the management data stored in the second block 112b. Numeral 203 is a step serving as initial transfer write means that acts when the determination of the mentioned Step 202 is YES, that is, the initial setting has not completed, and that transfers to the RAM memory 113 an initial value of semi-fixed control constants or variable control constants, which are stored in the first block 112a, and sets an initial setting flag.

The initial setting flag having been set herein will be stored and saved as one of history information in the first region of the second block 112b in a later-described Step Block 240.

Numeral 204 is a first flow determination step that acts when the determination of the mentioned Step 202 is NO, that is, the initial setting has completed, or subsequently to the mentioned Step 203, and that determines whether or not it is the first flow operation depending on whether or not the first operation flag, which is set in the later-described Step 207, is set. Numeral 205 is a step serving as system error determination means that acts when the determination of the mentioned Step 204 is YES, that is, the first flow is determined, and that carries out sum check operation with regard to data in the basic region of the first block 112a to detect the presence or absence of any lack and mix of bit information.

In addition, the basic region herein is a data region into which an input/output control program, learning control program, control constant processing program, fixed control constant, initial value data, reference data and the like are directly transferred and written by the external tool 104. Semi-fixed control constants to be written by the microprocessor as a result of initial measurement by the control operation are excluded.

Numeral 206 is a bifurcation step that acts subsequently to the mentioned Step 205, and that goes to Step 207 in the case where there is no error, e.g., any lack and mix of bit information in the basic region of the first block 112a, while goes to Step 230 in the case of error being present. Numeral 207 is a flag setting step for the first flow operation storage. Numeral 208 is a step, which acts subsequently to the mentioned Step 207, and in which the microprocessor 110 generates a power supply relay drive output DR1 and a load power supply relay drive output DR2. Numeral 209 is a step that acts subsequently to the mentioned Step 208, and determines whether or not save operation in the later-described Step Block 240 has been executed already. When the determination of the mentioned Step 209 is NO, that is, the save operation has not been executed yet, the program proceeds to the later-described operation end step 219.

Numeral 210 is an error determination step that acts when the determination of the mentioned Step 209 is YES, that is, the save operation has been executed already, and that executes a sum check operation with regard to the latest data of semi-fixed control constants, which are stored in the first block 112a, and variable control constants, which are stored in the second block 112b, to detect the presence or absence of lack and mix of bit information. Numeral 211 is a bifurcation step that acts subsequently to the mentioned Step 210, and that goes to Step 212 in the case of absence of sum check error, while goes to Step 215a in the case of presence of error. Numeral 212 is a band comparison step that determines whether or not semi-fixed control constants in the first block 112a or variable control constants in the second block 112b are a value between the upper and lower limit values of a reference data stored in the first block 112a.

Numeral 213 is a bifurcation step that acts subsequently to the mentioned Step 212, and that goes to Step 214 in the case of absence of error as a result of band comparison, and goes to Step 215a in the case of presence of error. Numeral 214 is a first transfer step transferring to and writing in the RAM memory 113 semi-fixed control constants in the first block 112a or the latest data of the second block 112b. Numeral 215a is a step that acts when the determination of the mentioned Step 211 is NO, that is, a sum check error is present, or when the determination of the mentioned Step 213 is NO, that is, a band comparison error is present, and that determines whether or not there is an old data having been stored last time in the second block 112b. Numeral 215b is a step that acts when the determination of the mentioned Step 215a is YES, that is, the old data remains, and after reading out this old data, proceeds to the mentioned Step 210, in which sum check of the readout data is executed.

Numeral 216 is an error history storage step that acts when the determination of the mentioned Step 215a is NO, that is, the old data is absent, and that stores error occurrence when the determination result in the mentioned Step 210 is error, or when there is a band comparison error in the mentioned Step 212. Numeral 217 is a step that acts subsequently to the mentioned Step 216, and generates an error output ER2. Numeral 218 is a second transfer step that acts subsequently to the mentioned Step 217, and that transfers to and writes in the RAM memory 113 an average value, representative value, or initial value data of a reference data to be stored in the first block 112a. Numeral 219 is an operation end step that acts subsequently to the mentioned Steps 214 and 218. The microprocessor 110 executes the other control operations in this operation end step, and thereafter goes to the operation start step 200 again.

Additionally, in the case where an error determination data, being a target in the mentioned Step 215a, is a semi-fixed control constant in the first block 112a, no old data exists resulting in the determination of NO. In the case where an error determination target data is a variable control constant in the second block 112b and the last learning data has been already stored in the second region or the third region, YES is determined.

Numeral 220 is a storage determination step that acts when the determination of the mentioned Step 204 is NO, that is, it is determined not to be the first flow operation, and that executes the sum check operation with regard to a storage region of at least variable control constants having been transferred to and written in the mentioned Step 214 or Step 218 out of data stored in the RAM memory 113 to detect the presence or absence of lack and mix of bit information. Numeral 221a is a step that acts subsequently to the mentioned Step 220 and that determines the presence or absence of rewrite by monitoring a flag indicating whether or not there is a rewrite history of variable control constants in the RAM memory 113. Numeral 221b is a step serving as coincidence determination means that acts when the determination of the mentioned Step 221a is NO, that is, the RAM memory 113 is not rewritten and altered, and that compares and determines whether or not a content of the second block 112b and a content of the transfer storage region of the RAM memory 113 are in coincidence.

Numeral 222 is a band comparison step that acts when the determination of the mentioned Step 221a is YES, that is, a rewrite is present, or subsequently to the mentioned Step 221b, and that determines whether or not semi-fixed control constant and variable control constant data, which are stored in the RAM memory 113, are values between the upper and lower limit values of a reference data stored in first block 112a. Numeral 223 is a bifurcation step that acts subsequently to the mentioned Step 222, and that goes to the operation end step 219 in the case where all determinations made in the mentioned Steps 220 to 222 are normal, and goes to Step 225 when any one of Steps determines error. Numeral 224 is a storage determination step block formed of the mentioned Steps 220 to 222. Numeral 225 is an error history storage step storing error occurrence when the determination result of the RAM memory 113 in the mentioned Step Block 224 is error. The program is arranged to proceed to the mentioned Step 209 subsequently to the mentioned Step 225.

Numeral 230 is an error history storage step for storing error determination in the case of error determination result when the mentioned Step 205 makes the error determination of the first block 112a. Numeral 231 is a step that acts subsequently to the mentioned Step 230, and that generates the error output ER1. The program is arranged to proceed to the mentioned end step 219 subsequently to the mentioned Step 231.

Numeral 240 is a save processing step block that acts when the determination of the mentioned Step 201 is NO and the power supply switch 107 is determined to be from ON to OFF, and that transfers and saves in the first block 112a or the second block 112b a variety of initial measured data or learning data having been stored in the RAM memory 113. Numeral 249 is a step that acts subsequently to the mentioned Step Block 240, and stops drive outputs DR1 and DR2. The program proceeds to the operation end step 219 subsequently to the mentioned Step 249.

Figure 3:
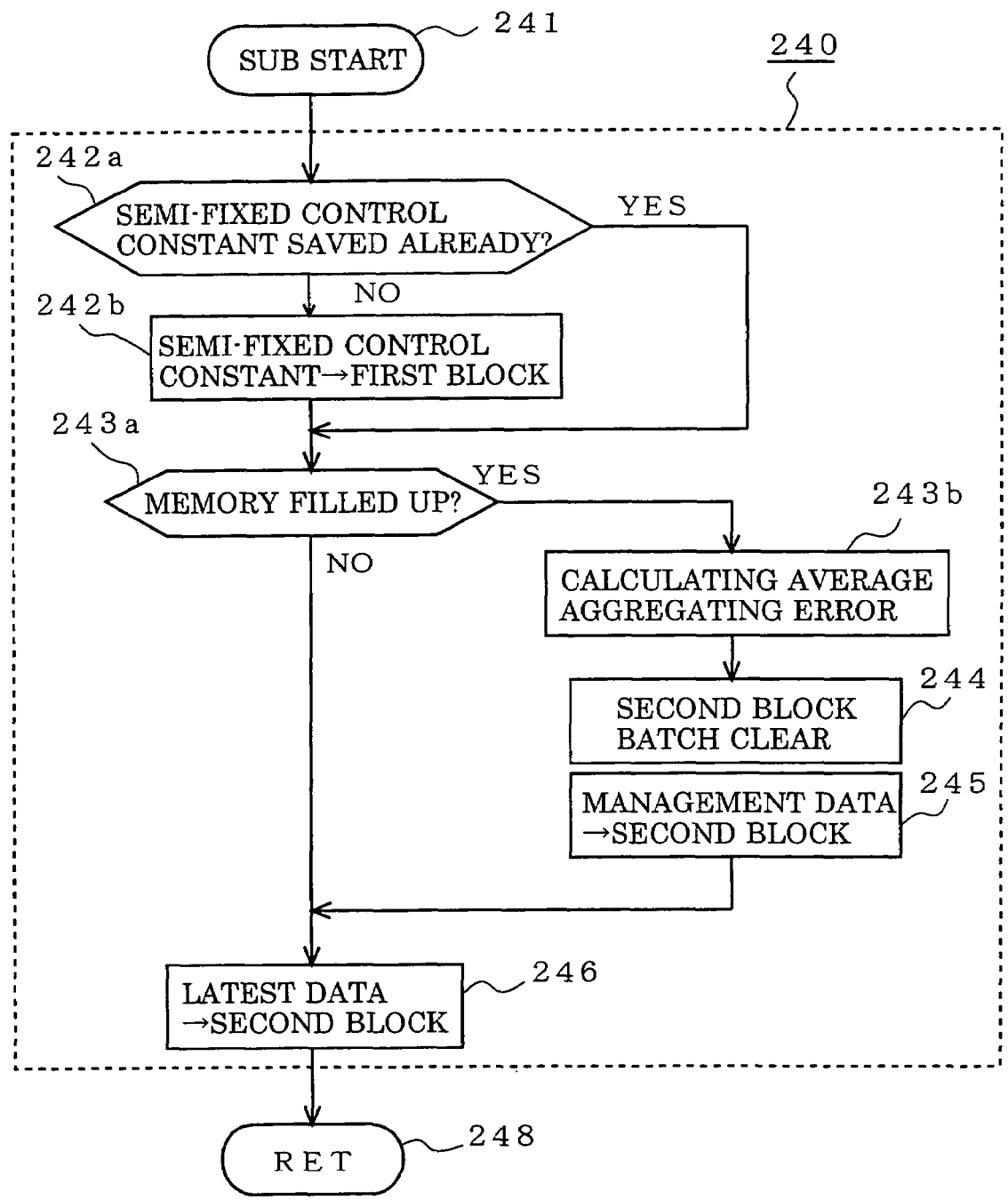
FIG. 3 is a flowchart for explaining a save processing operation in a save processing step block of the on-vehicle electronic control unit according to the first embodiment.

In addition, details of the mentioned Step Block 240 are as shown in FIG. 3.

Now, save processing operation of the save processing step block 240 is described referring to a flowchart of FIG. 3.

With reference to FIG. 3, numeral 241 is an operation start step of a subroutine program. Numeral 240 is Step Block of transfer save processing in FIG. 2. Numeral 248 is a step returning to the original step. The mentioned Step Block 240 is formed of Steps 242a to 246 as described hereinafter.

Numeral 242a is a step that acts subsequently to the mentioned Step 241, and that determines whether or not semi-fixed control constants have been already written and saved in the first block 112a by monitoring history information, being a management data in the second block 112b. Numeral 242b is a step that acts when the determination of the mentioned Step 242 is NO, that is, semi-fixed control constants have not been written yet, and that transfers and saves data of the corresponding region in the RAM memory 113 in the write region of a semi-fixed control constant of the first block 112a. The mentioned Step 242b serves as a first transfer save means.

Numeral 243a is a step that acts when the determination of the mentioned Step 242a is YES, semi-fixed control constants have been already saved, or subsequently to the mentioned Step 242b, and that determines whether or not the second block 112b is in the state of filled up to capacity in which the second block 112b is fully used up to the eleventh region. Numeral 243b is a step that acts when the determination of the mentioned Step 243a is YES, that is, the second block 112b is in the full state, and that calculates an average value of 10 times (saved in from the second region to the eleventh region) of 180 points of respective variable control constants, which are written in the second block 112b, or aggregates the number of times of error occurrence by error code number.

Numeral 244 is a step that acts subsequently to the mentioned Step 243b, and that executes batch clear of data in the second block 112b. Numeral 245 is a step that acts subsequently to the mentioned Step 244 and, that writes and saves in the first region of the second block 112b a management data having been calculated in the mentioned Step 243b and written in the RAM memory 113. Numeral 246 is a step that acts when the determination of the mentioned Step 243a is NO, that is, the second block 112b is not filled up to capacity, or subsequently to the mentioned Step 245, and that sequentially writes and saves the latest variable control constant having been learned and stored in the RAM memory 113 in the second region of the second block 112b. Numeral 248 is a return step to proceed subsequently to the mentioned Step 246. The mentioned Step 244 serves as batch clear means.

The operations as shown in FIGS. 2 and 3 are described again in summary. At the first operation responsive to the power supply switch 107 being turned on, error diagnosis of the basic region of the first block 112a is made by Step 205, and error diagnosis of the additional region of the first block 112a or the second block 112b is made by Step 210.

Supposing that any error is present in Step 205 corresponding to system error determination means, an error output ER1 is generated in Step 231 to cause the microprocessor 110 to reset and restart as shown in FIG. 1. Further, this error occurrence is counted and added by the count circuit 121a. Then, when a count addition value exceeds a predetermined value, the load power supply relay 106b is interrupted.

Furthermore, Step 230 acting as error history storage means stores an error code number, and this error code number is written and saved in the second block 112b in Step Block 240.

Supposing that any error is present in Step 210 or Step 212 corresponding to error determination means, an error code number is stored in Step 216 acting as error history storage means, and an error output ER2 is generated in Step 217 to bring the error alarm/display 106a of FIG. 1 in operation. Further, an average value, a representative value or an initial value of reference data is transferred from the first block 112a to the RAM memory 113 by Step 218 acting as the second transfer means.

In the case where there is no error in Step 210 corresponding to detection means of the lack and mix of bit information, it is determined by Step 212 acting as band comparison means whether or not semi-fixed control constants in the first block 112a or variable control constants in the second block 112b is a value within a range of reference data that is stored in the first block 112a.

In the case where Step 212 acting as band comparison means makes the normal determination, the program proceeds to Step 214 acting as the first transfer means, by which semi-fixed control constants in the first block 112a and variable control constants in the second bock 112b are transferred and written in the RAM memory 113.

As described above, after semi-fixed control constants or variable control constants have been written in the RAM memory 113, diagnosis of the RAM memory 113 is regularly carried out in Step Block 224 acting as storage determination means. In case of the presence of error in a content of the RAM memory 113, an error code number is stored in Step 225 acting as error history storage means, and write processing with respect to the RAM memory 113 is executed again by Step 214 or Step 218 depending on a state of the second block 112b.

When the power supply switch 107 is interrupted, an initial measured data, an management data, or error history information and various learning data are transferred to and saved in the first block 112a or the second block 112b by Step Block 240 acting as save processing means. Subsequently, a power supply relay drive output DR1 or a load power supply relay drive output DR2 is stopped by Step 249 acting as power supply delay interruption means.

The sum check, which is described in the mentioned Steps 205, 210, 220, is a method of detection of lack and mix of bit information. Sum check described herein is error detection means focusing, for example, on the fact that, by preliminarily having executed a binary addition of a number of data and having added a complement with respect to this addition value to the end of a data group, the binary addition of all data including the added complement data is executed at the time of sum check, and an addition result of all 0 will be obtained supposing that each data is normal.

In particular, to execute the sum check as to a segmented region such as semi-fixed control constant region in the first block 112a or the second region, the third region—the eleventh region in the second block 122b as Step 210 does, it is necessary to store a complement data in unit of each section.

Furthermore, in the case where a part of data forming a group is altered, it is general to calculate again and alter a complement data at the mentioned sum check as the entire memory. As for a flash memory not necessary to rewrite and alter on an as-needed basis, complements of respective data group to write is stored, thereby enabling to exert no influence on sum check as the entire memory.

As is understood from the foregoing descriptions, an on-vehicle electronic control unit 100a according to this first embodiment of the invention, as shown in FIGS. 1 to 3, which is formed of a microprocessor 110 provided with a non-volatile memory 111a in which a control program and a control constant corresponding to an uncontrolled vehicle are stored from an external tool 104, and a RAM memory 113 for operation processing, which controls an on-vehicle current consumer group 103 responsive to an input signal from on-vehicle sensor groups 101, 102 and a content of mentioned non-volatile memory 111a. In this on-vehicle electronic control unit 100a, at least a part of the mentioned control constants is transferred to the mentioned RAM memory 113 and processed as a variable control constant to be rewritten and altered as a learning operation result during operation. A flash memory in which data can be written after batch clear in a first and second block unit is employed as the mentioned non-volatile memory 111a.

In the first block 112a of mentioned non-volatile memory 111a, a control constant processing program formed of initial transfer write means 203, first and second transfer save means 242b, 246, update transfer write means 214, 218 and batch clear means 244, and an initial value data with respect to a semi-fixed control constant and a variable control constant are preliminarily stored from the mentioned external tool 104, in addition to an input/output control program, a learning control program and a fixed control constant. Further, a semi-fixed control constant is added and stored in this first block 112a after control operation, and a variable control constant is stored in the second block 112b of mentioned non-volatile memory 111a.

The mentioned initial transfer write means 203 is means that transfers mentioned initial value data to the mentioned RAM memory 113 at the start of control operation, and uses it as a control constant at the time where learning has not completed yet.

The mentioned first transfer save means 242b is means that adds and stores in a predetermined region of the mentioned first block 112a a semi-fixed control constant having been learned and stored during the control operation and written in the mentioned RAM memory 113.

The mentioned second transfer save means 246 is means that sequentially adds and stores a variable control constant having been learned and stored during the control operation and actual operation and having been sequentially updated and written in mentioned RAM memory 113 while updating an address of the mentioned second block.

The mentioned update transfer write means 214, 218 is means that transfers to the mentioned RAM memory 113 a semi-fixed control constant having been stored in the first block 112a by the mentioned first transfer save means 242b and the latest variable control constant having been stored in the second block 112b by the mentioned second transfer save means 246, and uses it as a control constant after learning has completed.

The mentioned batch clear means 244 is means by which batch clear is executed before the next addition an write is carried out in the state of an amount of variable control constants having been sequentially added and written in the mentioned second block 112b reaching a predetermined value, and which erases an entire data having been written in the second block 112b.

As a result, the non-volatile memory cooperating with the microprocessor is divided into a program memory region and a data memory region to be in shared use, whereby memory arrangement is simplified to be downsized and inexpensive.

Further, fixed control constants and semi-fixed control constants are also stored in the first block, being a program memory region other than a control program, and variable control constants are stored in the second block, being a data memory region. Thus, a memory capacity of the second block is reduced, and the number of times allowing batch clear to be executed is increased only as to a small capacity of memory region, thereby enabling to obtain an inexpensive flash memory.

Furthermore, save data are written plural times in the second block while changing addresses, and then batch clear will be executed. Thus, the number of times allowing rewrite to be executed is enormously increased as a whole.

In the on-vehicle electronic control unit according to this first embodiment of the invention, control constants to be written in the mentioned non-volatile memory 111a are further sorted into program inherent information and control unit inherent information, or vehicle inherent information and learning storage information; and a reference data for error determination with respect to a learning value is stored in the first block 112a of the mentioned non-volatile memory 111a.

The mentioned program inherent information is a fixed control constant, being an invariable design constant determined in association with mentioned input/output control program.

The mentioned control unit inherent information is calibration value information for compensating fluctuation of parts of an output voltage accuracy of a constant voltage power supply 118, a conversion accuracy of an AD converter or the like that are contained in the on-vehicle electronic control unit 100a, and is a semi-fixed control constant that is not changed after having once been stored as an initial measured value even though the semi-fixed control constants are different in respective individual products.

The mentioned vehicle inherent information is environmental information such as vehicle type information for selecting and determining control specification of a vehicle on which the on-vehicle electronic control unit 100a is mounted or characteristic accuracy information of an on-vehicle sensor externally connected to the on-vehicle electronic control unit 100a, and is a control constant that is not changed until the replacement of an externally connected part after having once been stored as an initial value or an initial measured value even though the control constants are of different values in respective individual vehicles. The vehicle inherent information is processed as the one that belongs to a semi-fixed control constant in this first embodiment.

The mentioned learning storage information is variation information such as driving control information obtained as a result of actually measuring driving characteristics of a vehicle or characteristic deterioration information of an on-vehicle sensor and current consumer, and is a variable control constant supposed to vary within a predetermined range after it has once been stored as an initial value at the start of operation.

The mentioned reference data includes a permissible variation range with respect to a permitted upper or lower limit value or a representative value relative to the mentioned semi-fixed control constant or variable control constant.

As a result, an advantage exists in that the semi-fixed control constants are stored in the first block 112a, whereby a data amount to be stored in the second block 112b is made as small as possible, and that the number of times allowing write to be executed with respect to the second block 112b is increased. Thus, the number of times allowing write as a whole to be executed may be increased even if a small number of times of batch clear in operation life of the second block 112b is allowed; and alternative processing can be executed by referring to a reference data at the time of error occurrence accompanied by learning operation or transfer processing.

Furthermore, in the on-vehicle electronic control unit according to this first embodiment of the invention, a control constant processing program to be stored in the mentioned first block 112a is further provided with error determination means 210, 212 and first and second transfer means 214, 218 with regard to the mentioned update transfer write means.

The mentioned error determination means is constituted of lack and mix detection means of bit information by sum check with respect to a semi-fixed control constant stored in the mentioned first block 112a or a variable control constant stored in the mentioned second block 112b, and band comparison means for comparing and determining whether or not a content of mentioned semi-fixed control constant or variable control constant is with in a permissible range specified by the mentioned reference data.

The mentioned first transfer means 214 is update transfer write means that is selected when the mentioned error determination means 210, 212 makes a normal determination, and that transfers to and writes in the mentioned RAM memory 113 a content of the mentioned semi-fixed control constant or variable control constant.

The mentioned second transfer means 218 is update transfer write means that is selected when the mentioned error determination means 210, 212 makes an error determination, and that transfers to and writes in the mentioned RAM memory 113 an estimated constant, being an average value or a representative value of mentioned reference data, or an initial value data.

As a result, an advantage exists in that any data, which has not preliminarily been transferred and written by a program tool 104 but has been written thereafter with respect to the flash memory 111a, is used while being self-checked, thus achieving improvement in safety.

Furthermore, in the on-vehicle electronic control unit according to this first embodiment of the invention, a control constant processing program to be stored in the mentioned first block 112a further contains a program acting as storage determination means 224 with respect to the mentioned RAM memory 113.

The mentioned storage determination means 224 is constituted of lack and mix detection means of bit information by sum check with respect to the mentioned RAM memory 113, coincidence determination means 221b of a variable control constant stored in the non-volatile memory 111a and a content of the RAM memory 113 before rewrite and alternation, or band comparison means 222 with respect to the mentioned reference data. Update transfer write is executed into the RAM memory 113 by the mentioned first or second transfer means 214, 218 when a content of the RAM memory 113 is determined erroneous by the mentioned storage determination means 224.

As a result, an advantage exists in that the semi-fixed control constants stored in the first block 112a and variable control constants stored in the second block 112b can immediately be transferred to the RAM memory 113 and used again by regularly making storage determinations even if a content of the RAM memory 113 is changed due to, e.g., noise malfunction during the operation, thus resulting in improvement in safety.

Further, in the on-vehicle electronic control unit according to this first embodiment of the invention, the first and second transfer save means 242a, 246, which is held in the mentioned first block 112a, is further means that acts in a delay period from the interruption of a power supply switch 107 to be brought in a closed circuit during operation of the on-vehicle electronic control unit 100a to the interruption of control power supply with respect to the on-vehicle electronic control unit 100a, and that stores and saves in the first and second blocks 112a and 112b of the mentioned flash memory 111a a semi-fixed control constant or a variable control constant stored in the mentioned RAM memory 113.

As a result, save processing with respect to the flash memory 111a is executed after operation control of a vehicle has ended. Consequently, an advantage exists in no influence on safety or controllability of vehicle traveling even if the save processing takes a long time.

Further, in the on-vehicle electronic control unit according to this first embodiment of the invention, a management data storage region is provided in the second block 112b of the mentioned flash memory 111 in which a variable control constant is written; and this management data includes an average value of a plurality of variable control constants having been stored in sequence at least before batch clear.

As a result, an advantage exists in that the change in average values is monitored, and this monitoring result can be utilized as reference information of vehicle control.

Further, in the on-vehicle electronic control unit according to this first embodiment of the invention, a compensation data is added to a plurality of semi-fixed control constants or variable control constants to be transferred and written from the RAM memory 113 by the mentioned first and second transfer save means 242b and 246; and this compensation data is a compensate data to make a sum value with respect to the entire save data including a compensation data zero, the compensation data being arranged to prevent a sum value of the whole from varying, even if a part of data in the flash memory 111a is changed by the mentioned first and second transfer save means 242a and 246.

As a result, an advantage exists in that it is unnecessary to rewrite or alter a sum data as a whole even if data to be stored in the flash memory 111a are sequentially added, thus giving no influence on rewrite life of the flash memory 111a.

Furthermore, in the on-vehicle electronic control unit according to this first embodiment of the invention, the first block 112a of the mentioned flash memory 111a further contains a program acting as error alarm/display means 217 operating responsive to the mentioned error determination means 210, 212.

The mentioned error alarm/display means 217 announces that the mentioned microprocessor 110 controls an on-vehicle current consumer 103 with a semi-fixed control constant or a variable control constant based on the mentioned second transfer means 218.

As a result, an advantage exists in that an erroneous state, e.g., semi-fixed control constants or variable control constants are not ideal values and fuel consumption or exhaust gas is not in the optimum conditions despite continuous traveling of a vehicle, is announced, thus inducing maintenance inspection.

Further, in the on-vehicle electronic control unit according to this first embodiment of the invention, a watchdog timer 120, a count circuit 121a, and a drive stop circuit 122 are further connected to the mentioned microprocessor 110; and the first block 112a of the mentioned flash memory 111a further contains a program acting as system error determination means 205.

The mentioned watchdog timer 120 is a timer circuit generating a reset signal output RST that causes the mentioned microprocessor 110 to temporally reset and restart when a pulse width of a watchdog signal WD, which mentioned microprocessor 110 generates, is erroneous.

The mentioned system error determination means 205 is constituted of lack and mix detection means of bit information by sum check with respect to at least a control program region of the mentioned first block; and is provided with a signal circuit that causes the mentioned microprocessor 110 to temporally reset and restart when the mentioned system error determination means 205 determines any error.

The mentioned count circuit 121a is a count circuit generating a count output when the number of times of reset of the microprocessor 110 by the mentioned watchdog timer 120 and system error determination means 205 exceeds a predetermined value; and is reset at the time of turning the power supply on.

The mentioned drive stop circuit 122 is a circuit that acts when the mentioned count circuit 121a generates a count output, and that stops a drive output of a load power supply relay 106b with respect to a part or all of the mentioned on-vehicle current consumer group.

As a result, an advantage exists in that the microprocessor 110 is restarted immediately at the time of error occurrence, thereby enabling to continue the normal operation supposing that the cause of error occurrence is temporary one due to noise. Further, a further advantage exists in that the power feed to a part of current consumers involved in safe driving is stopped, and save operation can be performed in the case of the presence of frequent noises or continuous errors.

Further, an error storage state is reset by once interrupting the power supply switch 107 to restart it. Consequently, an advantage exists in that it is possible to return again to the normal operation state in the case where the error is not a continuous one such as failure of parts or the like.

Furthermore, in the on-vehicle electronic control unit according to this first embodiment of the invention, the first block 112a of the mentioned flash memory 111a further contains a program acting as error history storage manes 216, 225, 230, and the second block 112b on the side in which a variable control constant is saved is further provided with a history information save region.

The mentioned error history storage means is data save means that acts when error occurrence is detected by any one of the mentioned system error determination means 205, error determination means 210, 212, or storage determination means 224, and stores error occurrence information in the mentioned RAM memory; and transfers to a history information save region of the mentioned second block 112b the error occurrence information of the RAM memory 113 having been stored by the mentioned error history storage means at the time of operation of the mentioned second transfer save means.

As a result, an advantage exists in that reference information with regard to vehicle environment can be obtained by monitoring error history having been sequentially written and saved.

Further, in the on-vehicle electronic control unit according to this first embodiment of the invention, an management data storage region is provided in the block 112b of the mentioned flash memory 111a, in which a variable control constant is written. The mentioned management data contains at least an error history aggregate data obtained by aggregating the number of occurrence of error history having been sequentially stored before batch clear for error code number.

As a result, an advantage exists in that reference information with regard to vehicle environment over a long period can be obtained by monitoring accumulated information of error history having been sequentially written and saved.

Embodiment 2

Figure 4:
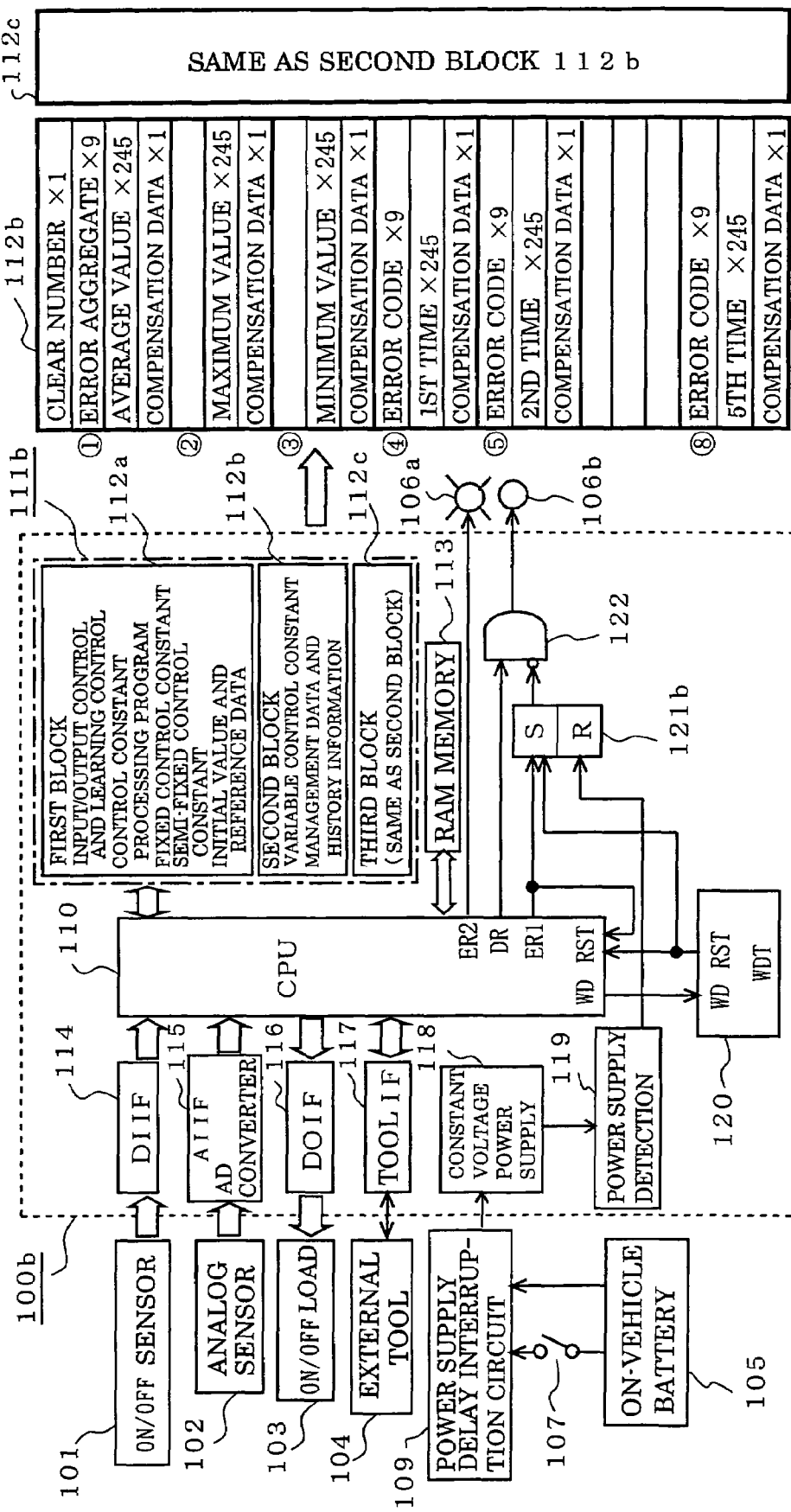
FIG. 4 is a block diagram showing an entire arrangement of an on-vehicle electronic control unit according to a second preferred embodiment.

FIG. 4 is a block diagram showing an entire arrangement of an on-vehicle electronic control device according to a second preferred embodiment of the invention.

The on-vehicle electronic control unit is hereinafter described focusing on points different from the on-vehicle electronic control unit according to the foregoing first embodiment shown in FIG. 1.

With reference to FIG. 4, numeral 100b designates an on-vehicle electronic control unit according to the second embodiment that is made of a sheet of electronic board, and is accommodated in a sealed housing.

First, elements to be connected to the outside of the on-vehicle electronic control unit 100b according to this second embodiment are described.

Numeral 101 designates an on-vehicle sensor group for ON/OFF operation. Numeral 102 designates an analog on-vehicle sensor group. Numeral 103 designates an on-vehicle current consumer group. Numeral 104 designates an external tool. Numeral 105 designates an on-vehicle battery. Numeral 107 designates a power supply switch. Numeral 106a designates an error alarm/display. Numeral 106b designates a load power supply relay. These elements are arranged in same manner as those in FIG. 1.

Numeral 109 designates a power supply delay interruption circuit, which acts as a switching circuit that conducts immediately after the closed circuit of the power supply switch 107, and that comes to be open-circuit delayed by a predetermined time period upon open circuit of the power supply switch 107.

Now, an internal arrangement of the mentioned on-vehicle electronic control unit 100b is described.

Numeral 110 designates a microprocessor. Numeral 111b designates a non-volatile memory, being a flash memory capable of making batch clear in a block unit. Numeral 112a designates a first block of this flash memory 110, and numeral 112b designates a second block. Numeral 112c designates a third block. Numeral 113 designates a RAM memory for operation processing. Numeral 114 designates an input signal interface circuit for ON/OFF signals. Numeral 115 designates an analog input interface circuit. Numeral 116 designates an output signal interface circuit. Numeral 117 designates a tool interface circuit.

The mentioned non-volatile memory 111b and RAM memory 113, interface circuits 114 to 117 are bus-connected to the mentioned microprocessor 110 in the same manner as in FIG. 1.

Numeral 118 designates a constant voltage power supply that is connected to the on-vehicle battery via the mentioned power supply delay interruption circuit 109. Numeral 119 designates a power supply detection circuit. Numeral 120 designates a watchdog timer. Any of these elements are arranged in the same manner as in FIG. 1.

Numeral 121b designates an error storage circuit such as flip-flop circuit provided with a set input S and a reset input R. This error storage circuit is set with a reset signal output RST from the mentioned watchdog timer 120 or an error output ER1, which the mentioned microprocessor 110 generates; and is reset with a power supply rise pulse provided by the mentioned power supply detection circuit 119.

Numeral 122 designates a drive stop circuit formed of an AND circuit. A logic inverting input of an error storage output from the mentioned error storage circuit 121b and a load power supply drive output DR from the mentioned microprocessor 110 are connected to inputs of this drive stop circuit 122. The mentioned load power supply relay 106b is connected to an output from the drive stop circuit 122.

The mentioned error alarm/display 106a is driven with an error output ER2, which the mentioned microprocessor 110 generates.

In addition, most of the on-vehicle current consumer group 103 is fed with an electric power from the on-vehicle battery 105 via the power supply switch 107. However, a part of on-vehicle current consumers giving an important influence on safe driving of a vehicle, for example, an open/close driving motor of an inlet throttle valve is fed with power via the load power supply relay 106b.

Now, action and operation of the on-vehicle electronic control unit according to the second embodiment shown in FIG. 4 are described.

With reference to FIG. 4, the microprocessor 110 controls the operation of the on-vehicle current consumer group 103 in accordance with an operation state of the on-vehicle sensor group 101 of ON/OFF operation, a signal level of the analog on-vehicle sensor group 102, and a content of the non-volatile memory 111b. In the non-volatile memory 111a, control programs or control constants have been preliminarily written from the external tool 104.

The non-volatile memory 111a is a flash memory including a memory capacity of, for example, 512 bytes as a whole. A capacity of memory is distributed into 504K bytes for the first block 112a, 4K bytes for the second block 112b, and 4K bytes for the third block 112c.

In the first block 112a, a later-described control constant processing program is stored in addition to an input/output control program-or a learning control program.

In the first block 112a, a constant storage region is provided other than the mentioned program region. In this constant storage region, a fixed control constant, semi-fixed control constant, an initial value data and reference data are stored.

In the second block 112b and third block 112c that are used alternately, a part of the remaining semi-fixed control constants regarded as variable control constants, a variable control constant, a management data, and history information are stored.

A fixed control constant to be stored in the constant storage region of the mentioned first block 112a relates to a program inherent information, being an invariable design constant determined in association with the mentioned input/output control program.

A semi-fixed control constant to be stored in the constant storage region of the mentioned first block 112a is calibration value information for compensating the fluctuation of parts of, e.g., an output voltage accuracy of the constant voltage power supply 118 contained in the on-vehicle electronic control unit 100a, or a conversion accuracy of the AD converter, not shown, contained in the input interface circuit 115. This semi-fixed control constant relates to control unit inherent information that is not varied after it has once been stored as an initial measured value even though semi-fixed control constants are of different values in respective individual products.

As semi-fixed control constants to be stored in the mentioned second block 112b or third block 112c, there are environmental information such as vehicle type information for selecting and determining control specification of a vehicle on which the on-vehicle electronic control unit 100b is mounted, and characteristic accuracy information of an on-vehicle sensor externally connected to the on-vehicle electronic control unit 100b. These semi-fixed control constants are not changed until the replacement of parts externally connected after having once been stored as an initial value or an initial measured value even though the vehicle inherent information has individually different values depending upon respective vehicles on each of which the on-vehicle electronic control unit is mounted. In this second embodiment, the vehicle inherent information is processed as a part of variable control constants.

An initial value data to be stored in the constant storage region of the mentioned first block 112a is 0 (zero) or a specific constant value to be used as a virtual value at a pre-stage where initial measurement or learning operation with regard to the mentioned semi-fixed control constant or variable control constant is executed.

A reference data to be stored in the constant storage region of the mentioned first block 112a is a data showing a permissible variation width with respect to a permitted upper or lower limit value or a representative value relative to the mentioned semi-fixed control constant or variable control constant. In case of initial measurement error or learning operation result error, an average value, a representative value or the mentioned initial value is used as an estimated value.

Furthermore, as described in the foregoing first embodiment, it is preferable that the mentioned reference data is at least data including the upper and lower limit values allowed to vary.

A variable control constant to be stored in the mentioned second block 112b or the third block 112c is fluctuation information such as operation control information that is obtained as a result of actually measuring driving characteristics of a vehicle or characteristic deterioration information of an on-vehicle sensor and a current consumer. This variable control constant relates to learning storage information assumed to vary within a predetermined range at an actual operation stage after it has once been stored as an initial value at the start of operation.

A management data to be stored in the mentioned second block 112b or third block 112c is the number of times of batch clear of the second block 112b or the third block 112c, and an average value, the maximum value and the minimum value of a number of variable control constants having been sequentially stored before batch clear.

A history management data to be stored in the mentioned second block 112b or third block 112c is an error history aggregate data obtained by aggregating by error code number the number of generations of error history having been sequentially stored before batch clear of the second block 112b or the third block 112c.

In the write region of the mentioned second block 112b or third block 112c, there is a region, for example, divided into 8 sections following data of the number of times of batch clear located at the leading position. In a unit region of one section, 255 points of data of which one data has 2 bytes of word length can be stored. Accordingly, a total of 255×2×8+2=4082<4096 (4K byte) bytes is used.

Out of 255 points of data, 245 points are allocated to various learning items, and the remaining 10 points are allocated to not more than 9 types of error occurrence code numbers and to 1 point of a later-described CRC check compensation data.

In the first region of the 8-piece write region, an average value of the last 10 times of 245 points of various learning items is stored. In the second region thereof, the maximum value of the past is stored. In the third region thereof, the minimum value of the past is stored.

Further, in this first region of the 8-piece write region, the accumulated number of times of occurrence in the past with respect to 9 types of error codes and a compensation data for CRC check are stored. Error code sections of the second region and the third region are in blank.

Furthermore, in the fourth to eighth regions of the 8-piece write region, 245 points of learning data, 9 types of error code numbers having occurred, and compensation data for CRC check are written.

In addition, the number of times of batch clear to be written in the leading position of the second block 112b or the third block 112c increases every time the second block 112b or the third block 112c is subject to batch clear. In the case were this number of times exceeds, for example, ten thousand times, an error will be announced by a later-described error determination means.

All data in the mentioned first block have preliminarily been transferred and written from the external tool 104 except for semi-fixed control constants. These semi-fixed control constants are initially measured by the microprocessor 110 at the time of shipping inspection of the on-vehicle electronic control unit 100b or at the time of the first energization, after being actually mounted on a vehicle, and is transferred and written in a blank region of the first block 112a via the RAM memory 113.

Semi-fixed control constants in the second block 112b or the third block 112c are also initially measured by the microprocessor 110 at the time of shipping inspection of the on-vehicle electronic control unit 100b or at the time of the first energization, being mounted actually on a vehicle, and are transferred and written via the RAM memory 1113.

Further, variable control constants in the second block 112b or the third block 112c is subject to learning and operation by means of the microprocessor 110 during actual driving of a vehicle, and transferred and written from the RAM memory 113 while sequentially changing a write region of the second block 112b or the third block 112c.

When learning data are sequentially written with respect to one of the second block 112b and the third block 112c, and then will be written up to the eighth region, the whole of the other block is brought in batch clear at this time. Then a management data are written in the first, second and third region with respect to the mentioned other block, and thereafter learning data having been newly generated will be written in the fourth region.

Thereafter, learning data are sequentially written with respect to the foregoing other block. When this other block is eventually filled up to capacity, a block in which learning data are written will be switched to the former side block.

When there is any error in the content of the second block 112b or the third block 112c, the error alarm/display 106a is operated with an error output ER2. When there is any error in a content of the first block 112a, an error output ER1 is generated to cause the microprocessor 110 to reset and restart. Further, this error occurrence is stored in the error storage circuit 121b to cause the load power supply relay 106b to be interrupted via the drive stop circuit 122.

The watchdog timer 120 monitors a watchdog signal WD, which the microprocessor 110 generates, and resets and restarts the microprocessor 110 in case of error occurrence in signal width. Further, the error storage circuit 121b stores this error occurrence to interrupt the load power supply relay 106b via the drive stop circuit 122.

Even if the error storage circuit 121b stores the error occurrence, and the load power supply relay 106b is interrupted, a fuel injection solenoid valve or an ignition coil can operate, thereby enabling to carry out a safe evacuation driving. Furthermore, in the case where the error occurrence is due to temporary noise malfunction, once interrupting and restarting the power supply switch 107, the error storage circuit 121b is reset by the power supply detection circuit 119, thus enabling the operation of the load power supply relay 106b to restore.

Figure 5:
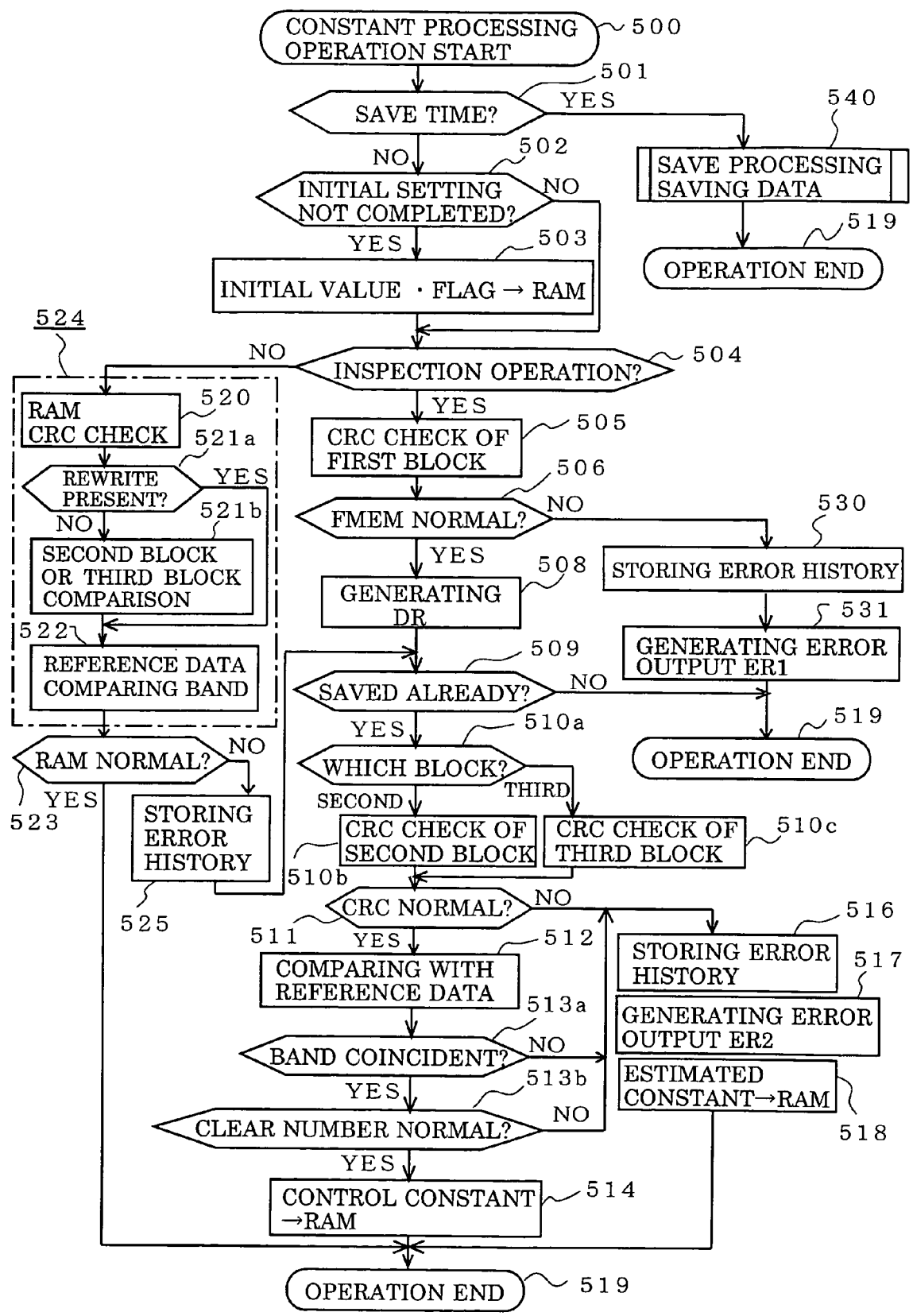
FIG. 5 is a flowchart for explaining operation of the on-vehicle electronic control unit according to the second embodiment.

Operations of the on-vehicle electronic control unit according to the second embodiment arranged as shown in FIG. 4 are now described referring to an explanatory flowchart of the operations shown in FIG. 5.

With reference to FIG. 5, numeral 500 is an operation start step of a control constant processing program executed by the microprocessor 110. Numeral 501 is a step that acts subsequently to the mentioned Step 500, and that determines whether or not it is the time for a learning data, which is stored in the RAM memory 113, to be evacuated in the second block 112b or the third block 112c. The mentioned Step 501 is such determination means as causes save processing to execute as a whole at a rate of once in several hours, for example, during a low-speed rotation of an engine, or at the time of interruption of the power supply switch 107.

Numeral 502 is a step that acts when the determination of the foregoing Step 501 is NO, that is, it is not save time, and that determines whether or not the initial setting has completed by monitoring a history flag, being one of management data stored in the second block 112b or the third block 112c. Numeral 503 is a step serving as initial transfer write means that acts when the determination of the mentioned Step 502 is YES, that is, the initial setting has not completed, and that transfers to the RAM memory 113 an initial value of semi-fixed control constants or variable control constants, which are stored in the first block 112a, and sets an initial setting flag. The initial setting flag having been set herein is stored and saved in the first region of the second block 112b or the third block 112c as one of history information in a later-described Step Block 540.

Numeral 504 is a step that acts when the determination of the mentioned Step 502 is NO, that is, the initial setting has completed, or subsequently to the mentioned Step 503, and that determines whether or not inspection operation is carried out. In the mentioned Step 504, normally the determination of NO is made by determination means, not shown; and the determination operation of YES is regularly made shortly after turning the power supply on, or at the time of low engine speed.

Numeral 505 is a step serving as system error determination means that acts when the determination of the mentioned Step 504 is YES, that is, the inspection is determined to be performed, and that executes CRC check with regard to the entire data, which are stored in the first block 112a, to detect the presence or absence of lack and mix of bit information.

Numeral 506 is a bifurcation step that acts subsequently to the mentioned Step 505, and that goes to Step 508 supposing that error, e.g., the lack and mix of bit information is absent in the first block 112a, and goes to Step 530 supposing that error is present. Numeral 508 is a step, in which the microprocessor 110 generates a load power supply relay drive output DR. Numeral 509 is a step that acts subsequently to the mentioned Step 508, and that determines whether or not save processing in the later-described Step Block 540 has been carried out. When the determination of the mentioned Step 509 is NO, that is, save processing has not been executed yet, the program proceeds to a later-described operation end step 519.

Numeral 510a is a step that acts when the determination of the mentioned Step 509 is YES, that is, save processing has been performed already, and that determines whether a block in current use is the second block 112b or the third block 112c. Numeral 510b is error determination means that acts when the mentioned Step 510a determines that the second block is in use, and that executes CRC check with regard to the entire data, which are stored in the second block 112b, to detect the presence or absence of lack and mix of bit information. Numeral 510c is an error determination step that acts when the mentioned Step 510a determines that the third block 112c is in use, and that executes CRC check with regard to the entire data, which are stored in the third block 112c, to detect the presence or absence of lack and mix of bit information.

Numeral 511 is a bifurcation step that acts subsequently to the mentioned Steps 510b and 510c, and that goes to Step 512 supposing that error, e.g., the lack and mix of bit information is absent in the second block 112b or the third block 112c, and goes to Step 516 supposing that error is present. Numeral 512 is a band comparison step determining whether or not data stored in the second block 112b or the third block 112c is a value between the upper and lower limit values of a reference data stored in the first block 112a.

Numeral 513a is a bifurcation step that acts subsequently to the mentioned Step 512, and that goes to Step 513b in the case of error being absent as a result of band comparison, and goes to Step 516 in the case of error being present. Numeral 513b is a bifurcation step that determines whether or not the number of times of batch clear, which is written in the leading position of the second block 112*b* or the third block 112, is not more than a predetermined frequency, and that goes to Step 516 in the case of exceeding a predetermined frequency, and goes to Step 514 in the case of being not more than a predetermined frequency.

Numeral 514 is a first transfer step transferring to and writing in the RAM memory 113 semi-fixed control constants in the first block 112*a* or the latest data of the second block 112*b* or the third block 112*c*. Numeral 216 is an error history storage step that acts when the determination of the mentioned Steps 511, 513*a*, 513*b* is NO. Numeral 517 is a step serving as error alarm display means that acts subsequently to Step 516, and that generates an error output ER2. Numeral 518 is a second transfer step that acts subsequently to the mentioned Step 517, and that transfers to and writes in the RAM memory 113 an average value, representative value, or initial value data of a reference data, which is stored in the first block 112*a*. Numeral 519 is an operation end step acting subsequently to the mentioned Steps 514 and 518. The microprocessor 110 executes the other control operations in this operation end step, and thereafter goes to the operation start step 500 again.

Numeral 520 is a storage determination step that acts when the determination of the mentioned Step 504 is NO, that is, inspection operation with respect to the flash memory 111*a* is determined not to be performed, and that executes CRC check with regard to a storage region of semi-fixed control constants or variable control constants having been transferred and written at least by the mentioned Step 514 or Step 518 out of data stored in the RAM memory 113 to detect the presence or absence of lack and mix of bit information. Numeral 521*a* is a step that acts subsequently to the mentioned Step 520, and that determines the presence or absence of rewrite by monitoring a flag indicating whether or not there is any rewrite history of variable control constants in the RAM memory 113. Numeral 521*b* is a step serving as coincidence determination means that acts when the determination of the mentioned Step 521*a* is NO, that is, data in the RAM memory 113 is not rewritten and altered, and that compares and determines whether or not the latest data in the second block 112*b* or the third block 112*c* and a content of the transfer storage region of the RAM memory 113 are in coincidence.

Numeral 522 is a band comparison step that acts when the determination of the mentioned Step 521*a* is YES, that is, rewrite is present, or subsequently to the mentioned Step 521*b*, and that determines whether or not semi-fixed control constant and variable control constant data, which are stored in the RAM memory 113, are values between the upper and lower limit values of a reference data stored in the first block 112*a*. Numeral 523 is a bifurcation step that acts subsequently to the mentioned Step 522, and that goes to the operation end step 519 in the case where all determinations made in the mentioned Steps 520 to 522 are normal, and goes to Step 525 when any one of Steps determines error. Numeral 524 is a storage determination Step Block formed of the mentioned Steps 520 to 522. Numeral 525 is an error history storage step that stores error determination when a determination result of the RAM memory 113 in the mentioned Step Block 524 is error. The program is arranged to proceed to the mentioned Step 509 subsequently to the mentioned Step 525.

Numeral 530 is an error history storage step that acts when the determination of the mentioned Step 506 is NO that is error is present in the first block 112*a*, and that stores this error presence. Numeral 531 is a step that acts subsequently to the mentioned Step 530, and that generates an error output ER1. The program is arranged to proceed to the mentioned end step 519 subsequently to the mentioned Step 531.

Numeral 540 is a save processing step block that acts when the determination of the mentioned Step 501 is YES, that is save processing is determined to do, and that transfers and saves in the first block 112*a*, the second block 112*b*, or the third block 112*c* a variety of initial measured data or learned data having been stored in the RAM memory 113. The program proceeds to the operation end step 519 subsequently to the mentioned Step block 540.

Figure 6:
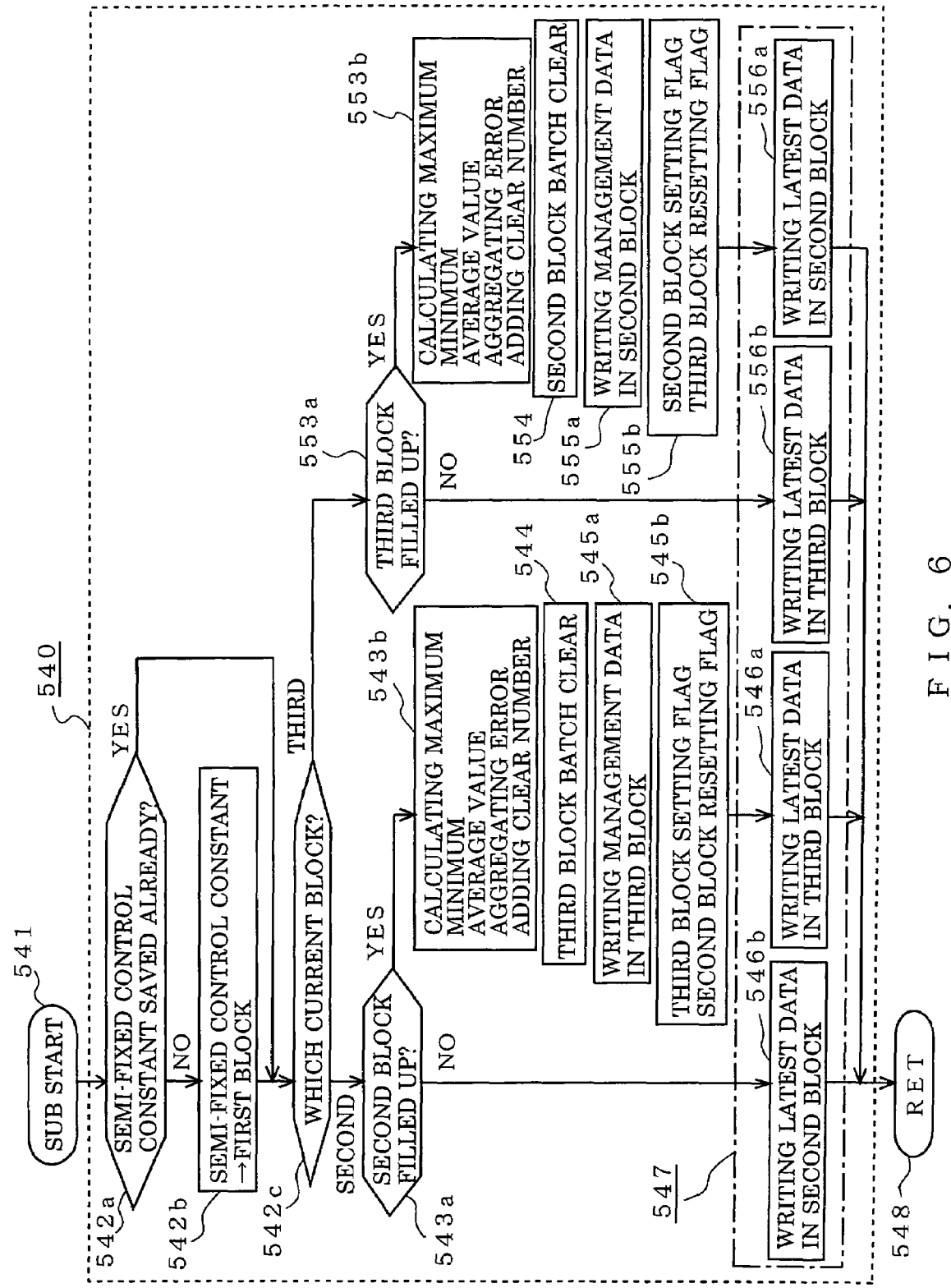
FIG. 6 is a flowchart for explaining a save processing operation in a save processing step block of the on-vehicle electronic control unit according to the second embodiment.

Furthermore, details of the mentioned save processing Step Block 540 are as shown in FIG. 6.

Now, save processing operations in the save processing step block 540 is described with the use of a flowchart of FIG. 6.

With reference to FIG. 6, numeral 541 is an operation start step of a subroutine program. Numeral 540 is Step Block of transfer save processing in FIG. 5. Numeral 548 is a step returning to the original step. The mentioned Step Block 540 is formed of Step 542*a* to Step Block 547 as described hereinafter.

Numeral 542*a* is a step that acts subsequently to the mentioned Step 541, and that determines whether or not a part of semi-fixed control constants has been written and saved in the first block 112*a* already by monitoring history information, being an management data in the second block 112*b* or the third block 112*c*. Numeral 542*b* is a step that acts when the determination of the mentioned Step 542*a* is NO, that is, a part of semi-fixed control constants has not been written yet, and that transfers and saves data in the corresponding region of the RAM memory 113 in the write region of semi-fixed control constants of the first block 112*a*. This Step 542*a* acts as a first transfer save means.

Numeral 542*c* is a step that acts when the determination of the mentioned Step 542*a* is YES, that is, a part of semi-fixed control constants has been saved already, or subsequently to the mentioned Step 542*b*, and that determines whether a block in current use is the second block 112*b* or the third block 112*c* by monitoring a state flag to be set in later-described Step 545*b* or Step 555*b*. Numeral 543*a* is a step that acts when the mentioned Step 542*c* determines that the second block 112*b* is in use, and that determines whether or not the second block 112*b* is in the full state of being used up to the eighth region. Numeral 543*b* is a step that acts when the determination of the mentioned Step 543*a* is YES, that is, the second block 1112*b* is in the full state, and that calculates an average value of ten times of respective 245 points of variable control constants (saved in the fourth region to the eighth region of the second and third blocks), which are written in the second block 112*b*, extracts the maximum value and the minimum value to calculate the maximum value and the minimum value including the maximum value and minimum value in the past, which are saved in the second region and the third region, aggregates the number of times of error occurrence by error code number, or reads out the number of times of batch clear, which is saved in the second block 112*b*, to calculate the number of times of erase to which 1 is added.

Numeral 544 is a step that acts subsequently to the mentioned Step 543*b*, and that executes batch clear of data in the third block 112*c*. Numeral 545*a* is a step that acts subsequently to the mentioned Step 544, and writes and saves a management data having been calculated in the mentioned Step 543*b* and having been written in the RAM memory 113 in the first, second, third regions of the third block 112c. Numeral 545b is a step for setting a state flag indicating that use of the third block 112c starts and resetting a state flag in order to indicate that the use of the second block 112b has ended. Numeral 546a is a step that acts subsequently to the mentioned Step 545b, and that writes and saves in the fourth region of the third block 112c the latest variable control constant having been learned and stored in the RAM memory 113. Numeral 546b is a step that acts when the determination of the mentioned Step 543a is NO, that is, the second block 112b is not filled up to capacity, and that sequentially writes and saves the latest variable control constant having been learned and stored in the RAM memory 113 of the fourth region onward of the second block 112b. Numeral 548 is a return step to proceed subsequently to the mentioned Steps 546a and 546b. The mentioned Step 544 acts as alternate batch clear means.

Numeral 553a is a step that acts when the mentioned Step 542c determines that the third block 112c is in use, and that determines whether or not the third block 112c is in the full state of being used up to the eighth region. Numeral 553b is a step that acts when the determination of the mentioned Step 553a is YES, that is, the third block 112c is in the full state, and that calculates an average value of ten times of respective 245 points of variable control constants (saved in the fourth region to the eighth region of the second and third blocks), which are written in the third block 112c, extracts the maximum value and the minimum value to calculate the maximum value and the minimum value including the maximum value and minimum value in the past, which are saved in the second region and the third region, aggregates the number of times of error occurrence by error code number, or reads out the number of times of batch clear, which is saved in the third block 112c, to calculate the number of times of erase to which 1 is added.

Numeral 554 is a step that acts subsequently to the mentioned Step 553b, and that executes batch clear of data in the second block 112c. Numeral 555a is a step that acts subsequently to the mentioned Step 554, and that writes and saves a management data having been calculated in the mentioned Step 553b and having been written in the RAM memory 113 in the first, second, and third regions of the second block 112b. Numeral 555b is a step for setting a state flag indicating that use of the second block 112b starts and resetting a state flag in order to indicate that the use of the third block 112c has ended. Numeral 556a is a step that acts subsequently to the mentioned Step 555b, and that writes and saves in the fourth region of the second block 112b the latest variable control constant having been learned and stored in the RAM memory 113. Numeral 556b is a step that acts when the determination of the mentioned Step 553a is NO, that is, the third block 112c is not filled up to capacity, and that sequentially writes and saves the latest variable control constant having been learned and stored in the RAM memory 113 in the fourth region onward of the third block 112b. The program proceeds to the mentioned return step 548 subsequently to Steps 556a and 556b. In addition, the mentioned Step 554 acts as alternate batch clear means.

Furthermore, numeral 547 is Step Block formed of the mentioned Steps 546a, 546b, 556a, and 556b. This Step Block acts as a second transfer save means.

The operations of FIGS. 5 and 6 are described in summary again. When Step 504 determines the execution of inspecting the flash memory 111b, the error diagnosis of the first block is executed in Step 505, or the error diagnosis of the second block 112b or the third block 112c is executed in the Step 510b or Step 510c.

When there is any error in Step 505 corresponding to system error determination means, an error output ER1 is generated in Step 531, causing the microprocessor 110 to reset and restart as shown in FIG. 4; and the error occurrence is stored by the error storage circuit 121b, bringing the load power supply relay 106b in interruption.

Furthermore, Step 530 acting as error history storage means stores an error code number, and this error code number is written and saved in the second block 112b or the third block 112c in Step Block 540.

When that there is any error in Steps 510b and 510c or Step 512 corresponding to error determination means, an error code number is stored in Step 516 acting as error history storage means, and an error output Er2 is generated in Step 517 to bring the error alarm/display 106a of FIG. 4 in operation. Further, an average value, a representative value, or an initial value of a reference data is transferred from the first block 112a to the RAM memory 113 by Step 518 acting as the second transfer means.

When there is no error in Steps 510b and 510c corresponding to detection means of the lack and mix of bit information, Step 512 acting as band comparison means determines whether or not a content of the second block 112b or the third block 112c is a value within a range of a reference data stored in the first block 112a.

In the case where Step 512 acting as band comparison means makes the normal determination, the program proceeds to Step 514 acting as the first transfer means, in which semi-fixed control constants in the first block 112a or semi-fixed control constants and variable control constants in the second block 112b or the third block 112c are transferred to and written in the RAM memory 113.

After semi-fixed control constants and variable control constants are written into the RAM memory 113 as described above, diagnosis of the RAM memory 113 is carried out regularly in Step Block 524 acting as storage determination means. When there is any error in a content of the RAM memory 113, an error code number is stored in Step 525 acting as error history storage means, and write processing with respect to the RAM memory 113 is executed again by Step 514 or Step 518 depending on a state of the second block 112b or the third block 112c.

At the time of save processing such as interruption of the power supply switch 107, an initial measured data, a management data, or error history information and various learning data are transferred to and saved in the first block 112 and the second block 112b or the third block 112c by Step Block 540 acting as save processing means.

CRC check as described in the mentioned Steps 505, 510b, 510c and 520 is one method of detection of the lack and mix of bit information. The CRC check herein (cyclic redundancy check) is the one that determines whether or not a remainder obtained by dividing a binary addition value in a data group such as in the first region to the eighth region by a predetermined value is the same as a remainder value having preliminarily been calculated.

Furthermore, in the case where a part of data forming a group is altered, it is general to calculate again and alter a remainder value at the mentioned CRC check as the entire memory. As for a flash memory not necessary to rewrite and alter on an as-needed basis, a compensation value with which a remainder value is 0 to each data group to be written, thereby enabling to give no influence on the CRC check as the entire memory.

As is understood from the foregoing descriptions, an on-vehicle electronic control unit 100b according to the second embodiment of the invention, as shown in FIGS. 4 to 6, which is formed of a microprocessor 110 provided with a non-volatile memory 111*b* in which a control program and a control constant corresponding to an uncontrolled vehicle are stored from an external tool 104, and a RAM memory 113 for operation processing. The on-vehicle electronic control unit 100*b* controls an on-vehicle current consumer group 103 responsive to an input signal from on-vehicle sensor groups 101, 102 and a content of the mentioned non-volatile memory 111*b*, and in which at least a part of the mentioned control constants is transferred to the mentioned RAM memory 113 and processed as a variable control constant to be rewritten and altered as a learning operation result during operation. In this on-vehicle electronic control unit, the mentioned non-volatile memory 111*b* employs a flash memory in which data can be written after batch clear in a first to third block unit. In the first block 112*a* of the mentioned non-volatile memory 111*b*, in addition to an input/output control program, a learning control program and a fixed control constant, a control constant processing program formed of initial transfer write means 503, first and second transfer save means 542*b*, 547, update transfer write means 514, 518 and alternate batch clear means 544, 554; and an initial value data with respect to a semi-fixed control constant and a variable control constant, are preliminarily stored from the mentioned external tool 104. Further, a semi-fixed control constant is added and stored in this first block 112*a* after control operation, and a variable control constant is stored in either the second block 112*b* or the third block 112*c* of the mentioned non-volatile memory 111*b*.

The mentioned initial transfer write means 503 is means that transfers the mentioned initial value data to the mentioned RAM memory 113 at the start of control operation, and uses it as a control constant at the time where learning has not completed yet.

The mentioned first transfer save means 542*b* is means that adds and stores in a predetermined region of the mentioned first block 112*a* a semi-fixed control constant having been learned and stored during the control operation and written in the mentioned RAM memory 113.

The mentioned second transfer save means 547 is means that sequentially adds and stores a variable control constant having been learned and stored during the control operation and actual operation and having been sequentially updated and written in the mentioned RAM memory 113 while updating an address of the mentioned second block 112*b* or third block 112*c*.

The mentioned update transfer write means 514, 518 are means that transfer to the mentioned RAM memory 113 a semi-fixed control constant having been stored in the first block 112*a* by the mentioned first transfer save means 542*b* and the latest variable control constant having been stored in the second block 112*b* of the third block 112*c* by the mentioned second transfer save means 547, and use it as a control constant after learning has completed.

The mentioned alternate batch clear means 544, 554 are means by which batch clear is executed before the next addition an write is carried out in the state of an amount of variable control constants having been sequentially added and written in the mentioned second block 112*b* of third block 112*c* reaching a predetermined value, and that erase the entire data having been written in the other block, and then start sequential addition and write (additional write) into the other block.

As a result, the non-volatile memory 111*b* cooperating with the microprocessor 110 is divided into a program memory region and a plurality of data memory region to be in shared use. Thus an advantage exists in that memory arrangement is simplified to be downsized and inexpensive.

Further, fixed control constants and semi-fixed control constants are also stored in the first block 112*a*, being a program memory region other than a control program, and a part of semi-fixed control constants and variable control constants are stored in the second block 112*b* or the third block 112*c*, being a data memory region. Thus, a memory capacity of the second block 112*b* and the third block 112*c* is reduced, and the number of times allowing batch clear to be executed is increased only as to a small capacity of memory region, thereby enabling to obtain an inexpensive flash memory.

Furthermore, save data are written plural times in the second block 112*b* or the third block 112*c* while changing addresses, and then batch clear will be executed. Thus, the number of times allowing rewrite as a whole to be executed is enormously increased.

In particular, the second block 112*b* and the third block 112*c* are provided to act as data memory. Consequently, an advantage exists in that, even if a power supply interruption state accidentally takes place in the state of batch clear of one of the blocks in which the old data are stored and data in the RAM memory 113 is disappeared, there is no damage to the latest data remaining in the other block.

Further, in the on-vehicle electronic control unit according to this second embodiment of the invention, control constants to be written in the mentioned non-volatile memory 111*b* are further sorted into program inherent information and control unit inherent information or vehicle inherent information and learning storage information; and a reference data for error determination with respect to a learning value is stored in the first block 112*a* of the mentioned non-volatile memory 111*b*.

The mentioned program inherent information is a fixed control constant, being an invariable design constant determined in association with the mentioned input/output control program.

The mentioned control unit inherent information is calibration value information for compensating fluctuation of parts of an output voltage accuracy of a constant voltage power supply 118, a conversion accuracy of an AD converter or the like contained in the on-vehicle electronic control unit 100*b*; and is a semi-fixed control constant that is not changed after having once been stored as an initial measured value even though the semi-fixed control constants are of different values in respective individual products.

The mentioned vehicle inherent information is environmental information such as vehicle type information for selecting and determining control specification of a vehicle on which the on-vehicle electronic control unit 100*b* is mounted, or characteristic accuracy information of an on-vehicle sensor externally connected to the on-vehicle electronic control unit 100*b*; and is a control constant that is not changed until the replacement of an externally connected part after having once been stored as an initial value or an initial measured value even though the control constants are of different values in respective individual vehicles. The vehicle inherent information is processed as apart of variable control constants in this second embodiment.

The mentioned learning storage information is variation information such as driving control information obtained as a result of actually measuring driving characteristics of a vehicle, or characteristic deterioration information of an on-vehicle sensor and current consumer; and is a variable control constant supposed to vary within a predetermined range after it has once been stored as an initial value at the start of operation.

The mentioned reference data includes a permissible variation width with respect to a permitted upper or lower limit value or a representative value relative to the mentioned semi-fixed control constant or variable control constant.

As a result, a part of semi-fixed control constants are stored in the first block 112a, whereby a data amount to be stored in the second block 112b or the third block 112c is made as small as possible, and the number of times allowing write to be executed into the second block 112b or the third block 112c is increased. Thus, an advantage exists in that the number of times allowing write as a whole to be executed may be increased even if a small number of times of batch clear in operation life of the second block 112b or the third block 112c is allowed; and that alternative processing can be executed on the basis of a reference data with respect to error occurrence due to learning operation or transfer processing.

Further, in the on-vehicle electronic control unit according to this second embodiment of the invention, a control constant processing program to be stored in mentioned first block 112a is further provided with error determination means 510b, 510c, 512 and first and second transfer means 514, 518 with regard to the mentioned update transfer write means.

The mentioned error determination means 510b, 510c, 512 is constituted of lack and mix detection means 510b, 510c of bit information by CRC check with respect to a variable control constant stored in the mentioned second block 112b or third block 112c, and band comparison means for comparing and determining whether or not a content of the mentioned variable control constant is within a permissible range specified in the mentioned reference data.

The mentioned first transfer means 514 is update transfer write means that is selected when the mentioned error determination means 510b, 510c, 512 makes a normal determination, and that transfers to and writes in the mentioned RAM memory 113 a content of the mentioned semi-fixed control constant or variable control constant.

The mentioned second transfer means 518 is update transfer write means that is selected when the mentioned error determination means 510b, 510c, 512 makes an error determination, and that transfers to and writes in the mentioned RAM memory 113 an estimated constant, being an average value or a representative value of the mentioned reference data, or an initial value data.

As a result, an advantage exists in that data, which are written into the flash memory 111b after having preliminarily been transferred and written by a program tool 104, are used while being self-checked, thus achieving improvement in safety.

Furthermore, in the on-vehicle electronic control unit according to this second embodiment of the invention, a control constant processing program to be stored in the mentioned first block 112a further contains a program acting as storage determination means 524 with respect to the mentioned RAM memory 113.

The mentioned storage determination means 524 is constituted of lack and mix detection means of bit information by CRC check with respect to the mentioned RAM memory 113, coincidence determination means 521b of a variable control constant stored in the non-volatile memory 111b and a content of the RAM memory 113 before rewrite and alternation, or band comparison means 522 with respect to mentioned reference data. Update transfer write in the RAM memory 113 is executed by the mentioned first transfer means 514 or second transfer means 518 when a content of the RAM memory 113 is determined to be erroneous by the mentioned storage determination means 524.

As a result, an advantage exists in that semi-fixed control constants stored in the first block 112a or variable control constants stored in the second block 112b or the third block 112c can be immediately transferred to the RAM memory 113 and used again by regularly making storage determinations even if a content of the RAM memory 113 is changed due to, e.g., noise malfunction during the operation, thus resulting in improvement in safety.

Further, in the on-vehicle electronic control unit according to this second embodiment of the invention, the first and second transfer save means 542a, 547, which are stored in the mentioned first block 112a, is further provided with means that acts at intervals of a predetermined time period after a power supply switch 107 being brought in a closed circuit during operation of the on-vehicle electronic control unit 100b, or in a delay period from the interruption of this power supply switch 107 to the interruption of control power supply to the on-vehicle electronic control unit 100b, and that stores and saves a semi-fixed control constant or a variable control constant stored in the mentioned RAM memory 113 in the first and second blocks 112a and 112b or in the first and third blocks 112a and 112c of mentioned flash memory 111a.

As a result, save processing is executed at intervals of suitable time period such as during stable traveling of a vehicle or at the time of operation control of a vehicle being ended. Consequently, an advantage exists in that the number of times of batch clear of the flash memory 111b is suppressed; and that the loss of valuable data accompanied with, e.g., abnormal discharge or with terminals open of the on-vehicle battery 105 is prevented.

Further, in the on-vehicle electronic control unit according to this second embodiment of the invention, the mentioned first block 112a further contains a program acting as error alarm/display means 517; and the number of times of batch clear of a variable control constant is stored as a management data in a block on the side in which a variable control constant is written, and the mentioned error alarm/display means 517 is means for performing error annunciation when the mentioned number of times of batch clear exceeds a predetermined value.

As a result, an advantage exists in that the number of times of batch clear of the second and third blocks 112b and 112c is monitored, and error annunciation is carried out when this number of times of batch clear exceeds a predetermined value, thus enabling to improve safety.

Furthermore, in the on-vehicle electronic control unit according to this second embodiment of the invention, a management data storage region is provided at the mentioned flash memory 111 in a block in which a variable control constant is written; and this management data includes at least an average value, or the maximum value and the minimum value of a plurality of variable control constants having been stored in sequence before batch clear.

As a result, an advantage exists in that, e.g., the change in average values or the maximum and minimum values and variation width thereof are monitored, and these monitoring results can be utilized as reference information of vehicle control.

Further, in the on-vehicle electronic control unit according to this second embodiment of the invention, a compensation data is added to a plurality of semi-fixed control constants or variable control constants to be transferred and written from the RAM memory 113 by the mentioned first and second transfer save means 542b and 547.

The mentioned compensation data is a compensate data with which a remainder value by CRC check with respect to the entire save data including a compensation data is zero, the compensation data being arranged to prevent a remainder value of the whole from varying even if a part of data in the flash memory 111b is changed by the mentioned first and second transfer save means.

As a result, an advantage exists in that it is unnecessary to rewrite or alter a check data as a whole even if data to be stored in the flash memory 111b are sequentially added, thus giving no influence on rewrite life of the flash memory 111b.

Furthermore, in the on-vehicle electronic control unit according to this second embodiment of the invention, the first block 112a of the mentioned flash memory 111b further contains a program acting as error alarm/display means 517 operating responsive to the mentioned error determination means 510b, 510c, 512.

The mentioned error alarm/display means 517 announces that the mentioned microprocessor 110 controls an on-vehicle current consumer 103 with a semi-fixed control constant or a variable control constant based on the mentioned second transfer means 518.

As a result, an advantage exists in that an erroneous state, e.g., semi-fixed control constants or variable control constants are not ideal values, for example, fuel consumption or exhaust gas is not in the optimum conditions despite continued traveling of a vehicle, is announced, thus inducing maintenance inspection.

Further, in the on-vehicle electronic control unit according to this second embodiment of the invention, a watchdog timer 120, an error storage circuit 121b, and a drive stop circuit 122 are further connected to the mentioned microprocessor 110, and the first block 112a of the mentioned flash memory 111a further contains a program acting as system error determination means 505.

The mentioned watchdog timer 120 is a timer circuit generating a reset signal output RST that causes the mentioned microprocessor 110 to temporally reset and restart when a pulse width of a watchdog signal WD, which mentioned microprocessor 110 generates, is erroneous.

The mentioned system error determination means 505 is constituted of lack and mix detection means 505 of bit information such as CRC check with respect to the whole of the mentioned first block or at least a control program region of the mentioned first block.

The mentioned error storage circuit 121b is a circuit storing that the mentioned system error determination means 505 makes an error determination, and that the mentioned watchdog timer 120 generates a reset signal output RST, and being reset at the time of turning the power supply on.

The mentioned drive stop circuit 122 is a circuit that acts when the mentioned error operation storage circuit 121b stores the error, and that stops a drive output of a load power supply relay 106b to a part or all of the mentioned on-vehicle current consumer group 103.

As a result, an advantage exists in that the microprocessor 110 is restarted immediately at the time of error occurrence, thereby enabling to continue the operation of the microprocessor 110 itself supposing that an error occurrence is temporary one due to noise. A further advantage exists in that the power feed with to apart of current consumers involved in safe driving is stopped, and save operation can be executed.

Further, an error storage state is reset by once interrupting the power supply switch 107, then restarting it. Consequently, an advantage exists in that it is possible to return again to the normal operation state in the case where the error is not a continuous one such as failure of parts or the like.

Further, in the on-vehicle electronic control unit according to this second embodiment of the invention, the first block 112a of the mentioned flash memory 111b further contains a program acting as error history storage manes 516, 525, 530, and a block on the side, in which a variable control constant is saved, is further provided with a history information save region.

The mentioned error history storage means is data save means that acts when error occurrence is detected by any one of mentioned system error determination means 505, error determination means 510b, 510c, 512 or storage determination means 524, and that stores error occurrence information in the mentioned RAM memory 113, and transfers the error occurrence information of the RAM memory 113 having been stored by the mentioned error history storage means at the time of operation of mentioned second transfer save means 547, to a history information save region of the mentioned variable control constant storage side block.

As a result, an advantage exists in that reference information with regard to vehicle environment can be obtained by monitoring error history having been sequentially written and saved.

Further, in the on-vehicle electronic control unit according to this second embodiment of the invention, an management data storage region is provided in a block of the mentioned flash memory 111b in which a variable control constant is written; and this management data contains at least an error history aggregate data obtained by aggregating the number of occurrence of error history having been sequentially stored before batch clear by error code number.

As a result, an advantage exists in that reference information with regard to vehicle environment over a long period can be obtained by monitoring an accumulated information of error history having been sequentially written and saved.

Embodiment 3

Figure 7:
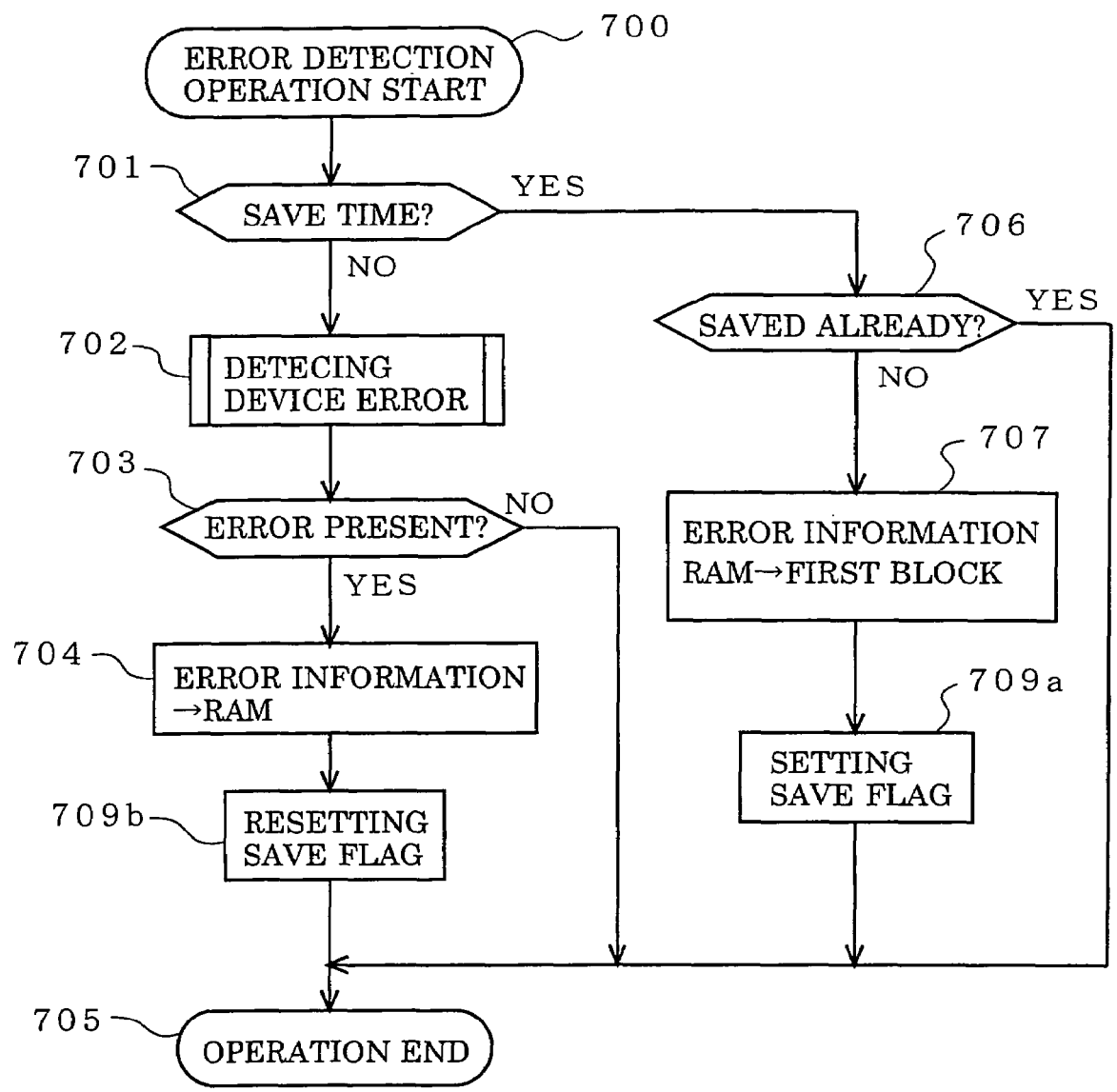
FIG. 7 is a flowchart for explaining operation of an on-vehicle electronic control unit according to a third preferred embodiment.

FIG. 7 is a flowchart for explaining operation of an on-vehicle electronic control unit according to a third preferred embodiment of the invention.

The on-vehicle electronic control unit according to this third embodiment is characterized in that the operations shown in FIG. 7 are added to the above-described on-vehicle electronic control unit according to the foregoing second embodiment shown in FIG. 4.

The operations of the on-vehicle electronic control unit according to this third embodiment are hereinafter described referring to FIG. 7 and FIG. 4.

With reference to FIG. 7, numeral 700 is a start step of device error detection operation, which the microprocessor 110 and the non-volatile memory 111b execute in cooperation. Numeral 701 is a step that acts subsequently to the mentioned Step 700, and that determines whether or not it is the time of saving error information, which is stored in the RAM memory 113, into the first block 112a. This Step 701 acts as determination means to cause save processing to be performed at a rate of once in several hours as a whole, for example, during a low-speed rotation of engine, or at the time of interruption of the power supply switch 107.

Numeral 702 is device error detection block acting when the determination of the mentioned Step 701 is No, i.e., it is not a save time. This error detection block is formed of a plurality of steps, not shown, and acts as self-diagnosis block that detects the disconnection error and short circuit error of wiring connection between the mentioned on-vehicle sensor groups 101 and 102 or on-vehicle current consumer group 103 and the mentioned on-vehicle electronic control unit 100*b*, detects characteristic error such as the fact that a detection signal value of the analog sensor is outside a predetermined range, or detects open and short circuit error of a power transistor, being a part of load drive elements in the output signal interface circuit 116.

Numeral 703 is a step that acts subsequently to the mentioned Step Block 702, and that determines whether or not error is detected in Step Block 702. Numeral 704 is a step that acts when the determination of the mentioned Step 703 is YES, that is, error is detected, and that stores the error information in the RAM memory 113. Numeral 709*b* is a step that acts subsequently to the mentioned Step 704, and that resets a save flag having been set in a later-described Step 709*a*. Numeral 705 is an operation end step that acts when the determination of the mentioned Step 703 is NO, that is, no error is detected, or subsequently to the mentioned Step 709*b*. The microprocessor 110 stands by for a while in the operation end step 705 to carry out the other control operations, and then returns to the mentioned operation start step 700 again to execute in cycle the error detection operation.

Additionally, in the mentioned Step 704, addresses are allocated to the RAM memory 113 so as to correspond to device numbers, which devices is an error detection target such as the mentioned on-vehicle sensor groups 101 and 102, on-vehicle current consumer group 103, or a part of power transistors in the mentioned output signal interface circuit 116; and a memory of 2 bits is prepared for each address.

In this memory of 2 bits, error detection information such as disconnection and open or short circuit is encoded and stored.

As storage means of error information in the mentioned RAM memory 113, instead of a method of storing error information by device number as described above, it is preferable to arrange such that a plurality of 8 bit memories are allocated to act as error information memory, and that error occurrence device number of not more than 6 bits and error code number of not more than 2 bits are stored at the time of error detection.

Numeral 706 is a step that acts when the determination of the mentioned Step 701 is YES, i.e., it is save time, and that determines whether or not error information has been saved already by determining whether or not a save flag is set in the later-described Step 709*a*. Numeral 707 is a step that acts when the mentioned Step 706 is NO, that is, error information has not been saved yet, and that transfers and saves the error information, which is stored in the RAM memory 113 in the foregoing Step 704, in the first block 112*a* of the non-volatile memory 111*b*. Numeral 709*a* is a step that acts subsequently to the mentioned Step 707, and that sets a save flag allocated in the mentioned RAM memory 113. When the determination of the mentioned Step 706 is YES, that is, error information has been saved already, or subsequently to the mentioned Step 709*a*, the program proceeds to the operation end step 705.

The operations heretofore are described in summary. Step Block 702 acting as device error detection means regularly operates in cycle. In this Step Block 702, when error is detected, the error information is written in the RAM memory 113 in Step 704 acting as error occurrence storage means.

Step 707 acting as the third transfer save means is activated, for example, about once in several hours. In this Step 707, the error information having been stored in the RAM memory 113 by Step 704 is transferred to the first block 112*a* of the non-volatile memory 111*b*. Thus, even if power supply terminals come to be disconnected due to, e.g., replacement of the on-vehicle battery 105, or error information cannot be stored in the RAM memory 113 due to abnormal voltage drop, the error information will be stored in the non-volatile memory 111*b*.

As is understood from the foregoing descriptions, in the on-vehicle electronic control unit according to the third embodiment of this invention, the first block 112*a* of the mentioned non-volatile memory 111*b* further contains a program acting as device error detection means 702, error occurrence storage means 704, and a third transfer save means 707. The mentioned device error detection means 702 is means for detecting disconnection and short circuit error of input/output wiring to at least a part of the mentioned on-vehicle sensor groups 101 and 102 or on-vehicle current consumer group 103 or a detection characteristic error of sensor, or at least a part of short circuit error and open error of load drive element. The mentioned error occurrence storage means 704 is means for storing in the mentioned RAM memory 113 error occurrence information having been detected by the mentioned device error detection means 702. The mentioned third transfer save means 707 is means for transferring to and saving the error occurrence information having been stored in the RAM memory by the mentioned error occurrence storage means 704 in a device error information storage region provided in the first block 112*a* of the mentioned non-volatile memory 111*b*.

As a result, even if there is any voltage drop error of the on-vehicle battery 105, any power supply terminal open at the time of maintenance replacement or the like, the error information having once been stored in the non-volatile memory 111*b* is exactly saved. In the case where, for example, an exhaust gas sensor in the on-vehicle sensor group 102 falls into an error and this exhaust gas sensor is replaced, error information is read out with the external tool 104 to confirm content of the error; further an entire data in the non-volatile memory 111*b* are read out to a memory in the external tool 104, and then batch clear of the non-volatile memory 111*b* is executed; and furthermore semi-fixed control constants, variable control constants or error information having been learned and stored with regard to this exhaust gas sensor are deleted, and then batch transfer and write into the non-volatile memory 111*b* is executed again, whereby new learning information can be written.

In addition, in the above-described descriptions, it is arranged that the operations shown in FIG. 7 are added to the on-vehicle electronic control unit according to the foregoing second embodiment shown in FIG. 4. However, it is also preferable to arrange that the operations shown in FIG. 7 are added to the on-vehicle electronic control unit according to the first embodiment shown in FIG. 1.

Embodiment 4

Figure 8:
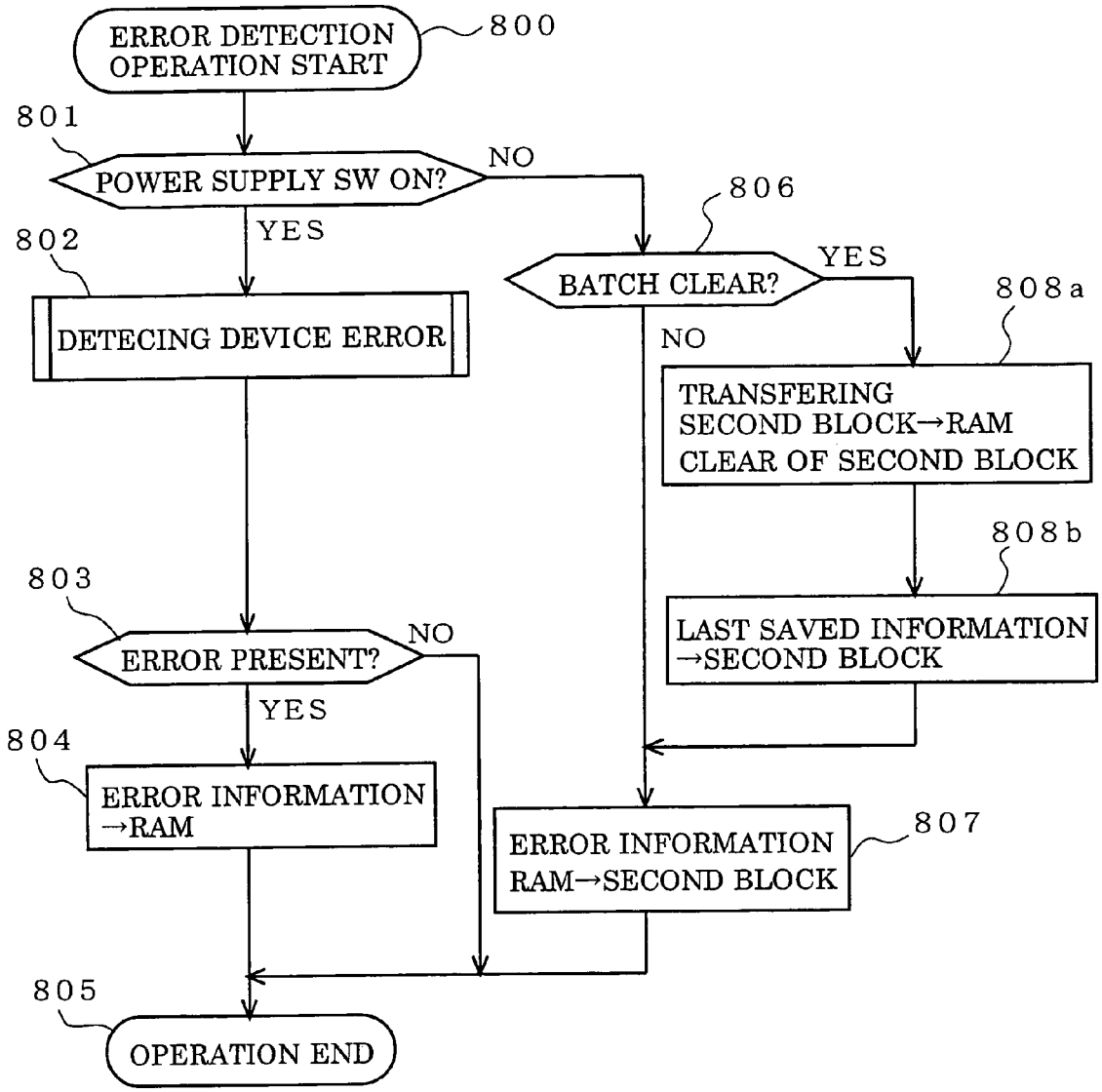
FIG. 8 is a flowchart for explaining operation of an on-vehicle electronic control unit according to a fourth preferred embodiment.

FIG. 8 is a flowchart for explaining operation of an on-vehicle electronic control unit according to a fourth preferred embodiment of the invention.

The on-vehicle electronic control unit according to this fourth embodiment is characterized in that the operations shown in FIG. 8 are added to the above-described on-vehicle electronic control unit according to the foregoing first embodiment shown in FIG. 1.

The operations of the on-vehicle electronic control unit according to this fourth embodiment are hereinafter described referring to FIG. 8 and FIG. 1.

With reference to FIG. 8, numeral 800 is a start step of device error detection operation, which the microprocessor 110 and the non-volatile memory 111a execute in cooperation. Numeral 801 is a step that acts subsequently to the mentioned Step 800, and that determines whether or not the power supply switch 107 is ON.

Numeral 802 is a device error detection block operating when the determination of the mentioned Step 801 is YES, that is, the power supply switch 107 is in a closed circuit. This error detection block is formed of a plurality of steps, not shown, and acts as self-diagnosis block that detects the disconnection and short circuit error of wiring connection between the mentioned on-vehicle sensor groups 101 and 102 or on-vehicle current consumer group 103 and the mentioned on-vehicle electronic control unit 100a, detects characteristic error such as the fact that a detection signal value of the analog sensor is outside a predetermined range, or detects open and short circuit error of a power transistor, being a part of load drive elements in the output signal interface circuit 116.

Numeral 803 is a step that acts subsequently to the mentioned Step Block 802, and determines whether or not error is detected in Step Block 802. Numeral 804 is a step that acts when the determination of the mentioned Step 803 is YES, that is, error is detected, and that stores error information in the RAM memory 113. Numeral 805 is an operation end step acting when the determination of the mentioned Step 803 is NO, that is, no error is detected, or subsequently to the mentioned Step 804. The microprocessor 110 stands by for a while in the operation end step 805 to execute the other control operations, and then returns to the mentioned operation start step 800 again to carry out error detection operations in cycle.

Additionally, in the mentioned Step 804, addresses are allocated to the RAM memory 113 so as to correspond to device numbers, which devices is an error detection target such as the mentioned on-vehicle sensor groups 101 and 102, on-vehicle current consumer group 103, or a part of power transistors in the mentioned output signal interface circuit 116; and a memory of 2 bits is prepared for each address.

In this memory of 2 bits, error detection information such as disconnection and open or short circuit is encoded and stored.

As storage means of error information in the mentioned RAM memory 113, instead of a method of storing error information by device number as described above, it is preferable to arrange such that a plurality of 8 bit memories are allocated to act as error information memory, and that error occurrence device number of not more than 6 bits and error code number of not more than 2 bits are stored at the time of error detection.

Numeral 806 is a step that acts when the determination of the mentioned Step 801 is NO, that is, the power supply switch 107 is in an open circuit, and the power supply relay 108a is in the state of self-hold operation with a drive output DR1, and that determines whether or not it is necessary to execute batch clear in response to the fact that the second block 112b of the mentioned non-volatile memory 111a is filled up to capacity with learning information. Numeral 807 is a step that acts when the determination of the mentioned Step 806 is NO, that is, no batch erase is performed, and that transfers and saves the error information having been stored in the RAM memory 113 in the mentioned Step 804 in the second block 112b of the non-volatile memory 111a. Numeral 808a is a step that acts when the determination of the mentioned Step 806 is YES, that is, it is necessary to perform batch clear, and that once transfers en entire data having been stored in the second block 112b to the RAM memory 113 and thereafter executes batch clear of the entire data having been written in the second block 112b. Numeral 808b is a step that acts subsequently to the mentioned Step 808a, and that transfers to and writes again the error information having been stored in the second block before batch clear into the second block 112b. The program goes to the mentioned Step 807 subsequently to the mentioned Step 808b, and proceeds to the operation end step 805 subsequently to the mentioned Step 807.

The operations heretofore are described in summary. Step Block 802 acting as device error detection means regularly operates in cycle. When any error is detected, the error information is written in the RAM memory 113 in Step 804 acting as error occurrence storage means.

Step 807 acting as the fourth transfer save means acts when the power supply switch 107 is brought in an open circuit having once been in a closed circuit, and transfers the error information having been stored in the RAM memory 113 in Step 804 to the second block 112b of the non-volatile memory 111a. Thus, even if power supply terminals come to be disconnected due to, e.g., replacement of the on-vehicle battery 105 or error information cannot be stored in the RAM memory 113 due to abnormal voltage drop, error information will be stored in the non-volatile memory 111b.

Step 808b acting as re-transfer save means is a step that acts when batch clear of the second block 112b is executed, and that writes and saves again in the second block 112b the error information having been stored in the second block 112 before batch clear.

As is understood from the foregoing descriptions, in the on-vehicle electronic control unit according to this fourth embodiment of the invention, the first block 112a of the mentioned non-volatile memory 111a further contains a program acting as device error detection means 802, error occurrence storage means 804, a fourth transfer save means 807, and retransfer save means 808b. The mentioned device error detection means 802 is means for detecting disconnection and short circuit error of input/output wiring with respect to at least a part of the mentioned on-vehicle sensor groups 101 and 102 or on-vehicle current consumer group 103 or a detection characteristic error of sensor, or at least a part of short circuit and open errors of a load drive element. The mentioned error occurrence storage means 804 is means for storing error occurrence information having been detected by the mentioned device error detection means 802 in the mentioned RAM memory 113. The mentioned fourth transfer save means 807 is means for transferring and saving the error occurrence information having been stored in the RAM memory 113 by the mentioned error occurrence storage means 804 in a device error information storage region provided in the second block 112b of the mentioned non-volatile memory 111a. The mentioned retransfer save means 808b is means for writing and saving again an error information having been saved before batch clear of the mentioned second block 112b in a device error information storage region of the second block 112b after batch clear.

As a result, even if there is any voltage drop error of the on-vehicle battery 105, any power supply terminal open at the time of maintenance replacement or the like, the error information having once been stored in the non-volatile memory 111a is exactly saved. In the case where, for example, an exhaust gas sensor in the on-vehicle sensor group 102 falls into an error and this exhaust gas sensor is replaced, error information is read out with the external tool 104 to confirm content of the error; further an entire data in the non-volatile memory 111a are read out to a memory in the external tool 104, and then batch clear of the non-volatile memory 111a is executed; and furthermore semi-fixed control constants, variable control constants or error information having been learned and stored with regard to this exhaust gas sensor are deleted, and then batch transfer and write into the non-volatile memory 111a is executed again, whereby new learning information can be written.

Further, an advantage exists in that, in the case of the on-vehicle sensor groups 101 and 102 or the on-vehicle current consumer group 103 possessing no semi-fixed control constants or variable control constants necessary to be learned and stored, the on-vehicle sensor groups 101 and 102 or the on-vehicle current consumer group 103 being the one of which error occurrence information is merely saved, it is unnecessary to alter a content of the first block 112a at the time of replacement of error occurrence part, and error information in the second block 112b is only deleted, resulting in an easier maintenance replacement work.

Embodiment 5

Figure 9:
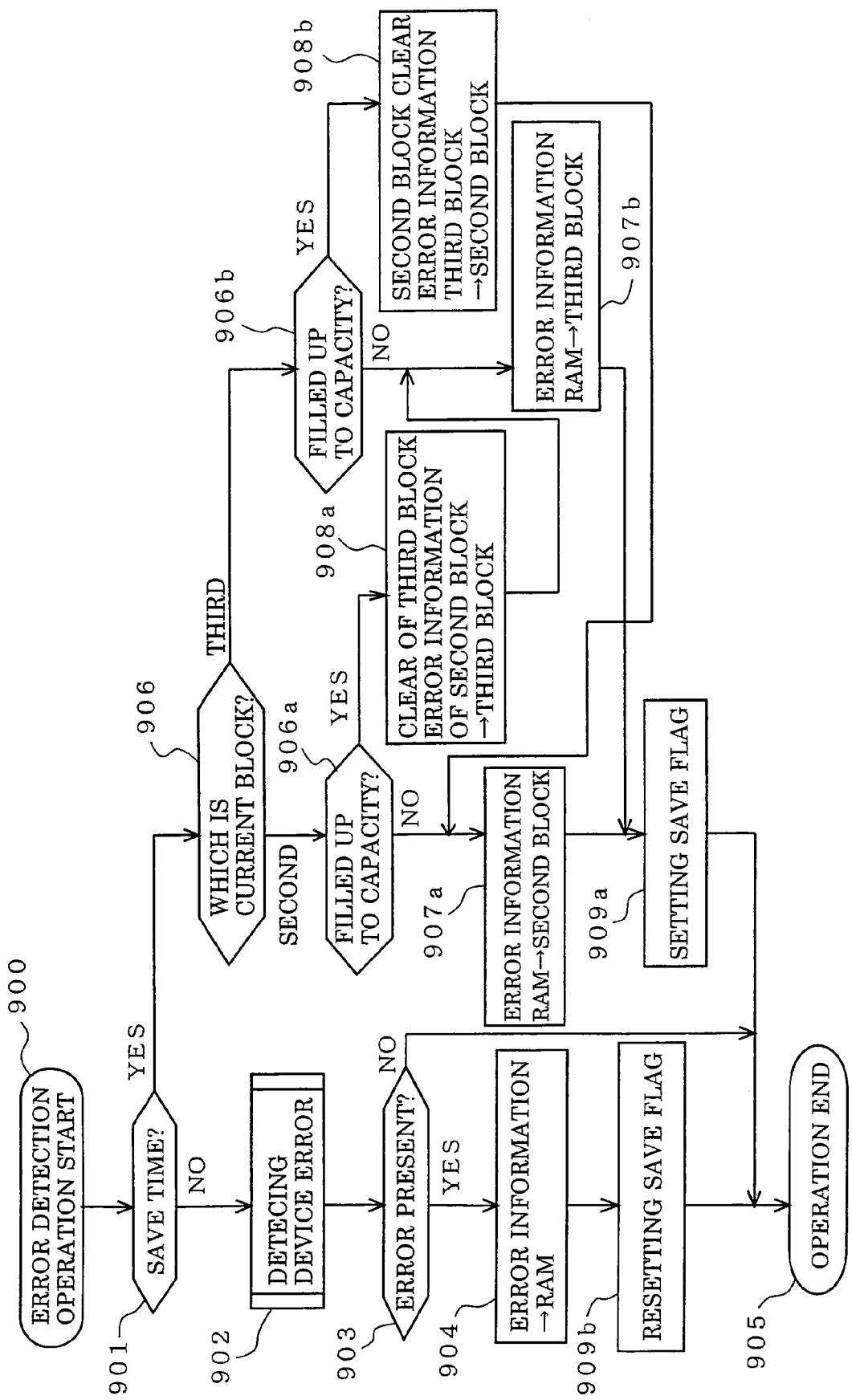
FIG. 9 is a flowchart for explaining operation of an on-vehicle electronic control unit according to a fifth preferred embodiment.

FIG. 9 is a flowchart for explaining operation of an on-vehicle electronic control unit according to a fifth preferred embodiment of this invention.

The on-vehicle electronic control unit according to this fifth embodiment is characterized in that the operations shown in FIG. 9 are added to the above-described on-vehicle electronic control unit according to the foregoing second embodiment shown in FIG. 4.

The operations of the on-vehicle electronic control unit according to this fifth embodiment are hereinafter described referring to FIG. 9 and FIG. 4.

With reference to FIG. 9, numeral 900 is a start step of device error detection operation, which the microprocessor 110 and the non-volatile memory 111b execute in cooperation. Numeral 901 is a step that acts subsequently to the mentioned Step 900, and that determines whether or not it is time of saving error information, which is stored in the RAM memory 113, in the second block 112b or the third block 112c. This Step 901 is such determination means as causes save processing to perform at a rate of once in several hours as a whole, for example, during a low-speed rotation of an engine, or at the time of interruption of the power supply switch 107.

Numeral 902 is device error detection block acting when the determination of the mentioned Step 901 is No, that is, it is not saving time. This error detection block is formed of a plurality of steps, not shown, and acts as self-diagnosis block that detects disconnection and short circuit error of wiring connection between the mentioned on-vehicle sensor groups 101 and 102 or on-vehicle current consumer group 103 and the mentioned on-vehicle electronic control unit 100b, detects characteristic error such as the fact that a detection signal value of the analog sensor is outside a predetermined range, or detects open and short circuit error of a power transistor, being a part of load drive elements in the output signal interface circuit 116.

Numeral 903 is a step that acts subsequently to the mentioned Step Block 902, and that determines whether or not error is detected in Step Block 902. Numeral 904 is a step that acts when the determination of the mentioned Step 903 is YES, that is, error is detected, and that stores the error information in the RAM memory 113. Numeral 909b is a step that acts subsequently to the mentioned Step 904, and that resets a save flag having been set in a later-described Step 909a. Numeral 905 is an operation end step that acts when the determination of the mentioned Step 903 is NO, that is, no error is detected, or subsequently to the mentioned Step 909b. The microprocessor 110 stands by for a while in the operation end step 905 to carry out the other control operations, and then returns to the mentioned operation start step 900 again to execute in cycle the error detection operations.

Additionally, in the mentioned Step 904, addresses are allocated to the RAM memory 113 so as to correspond to device numbers, which devices is an error detection target such as the mentioned on-vehicle sensor groups 101 and 102, on-vehicle current consumer group 103, or a part of power transistors in the mentioned output signal interface circuit 116; and a memory of 2 bits is prepared for each address.

In this memory of 2 bits, error detection information such as disconnection and open or short circuit is encoded and stored.

As storage means of error information in the mentioned RAM memory 113, instead of a method of storing error information by device number as described above, it is preferable to arrange such that a plurality of 8 bit memories are allocated to act as error information memory, and that error occurrence device number of not more than 6 bits and error code number of not more than 2 bits are stored at the time of error detection.

Numeral 906 is a step determining whether a variable control constant storage block in current use is the second block 112b or the third block 112c. The program goes to Step 906a in the case of the second block, and goes to Step 906b in the case of the third block.

Numeral 906a is a step determining whether or not the second block 112b in current use if filled with learning information. Numeral 907a is a step that acts when the determination of the mentioned Step 906a is NO, that is, the second block 112b is not in the full state, or subsequently to the later-described Step 908b, and that transfers and saves the error information having been stored in the RAM memory 113 in the mentioned Step 904 in the second block 112b of the non-volatile memory 111b. Numeral 908a is a step that acts when the determination of the mentioned Step 906a is YES, that is the second block 112b is filled up to capacity with learning information, and that executes batch clear of the third block 112c in an inactive state, and then transfers again the error information stored in the second block 112b to the third block 112c.

Numeral 909a is a step that acts subsequently to the mentioned Step 907a or the later-described Step 907b, and that sets a save flag allocated in the mentioned RAM memory 113. The program proceeds to the operation end step 905 subsequently to the mentioned Step 909a.

Numeral 906b is a step determining whether or not the third block 112c in current use is filled to capacity with learning information. Numeral 907b is a step that acts when the determination of the mentioned Step 906b is NO, that is, the third block 112c is not in the full state, or subsequently to the mentioned Step 908a, and that transfers to and saves in the third block 112c of the non-volatile memory 111b the error information having been stored in the RAM memory 113 in the mentioned Step 904. Numeral 908b is a step that acts when the determination of the mentioned Step 906b is YES, that is, the third block 112c is filled to capacity with learning information, and executes batch clear of the second block 112b in an inactive state, and then transfers again the error information stored in the third block 112c to the second block 112b.

The operations heretofore are described in summary. Step Block 902 acting as device error detection means regularly operates in cycle. When any error is detected, the error information will be written in the RAM memory 113 in Step 904 acting as error occurrence storage means.

Step 907a or Step 907b acting as the fourth transfer save means is activated, for example, about once in several hours. The error information having been stored in the RAM memory 113 is transferred to the second block 112b or the third block 112c of the non-volatile memory 111b in Step 904. Thus, even if power supply terminals come to be disconnected due to, e.g., replacement of the on-vehicle battery 105, or error information cannot be stored in the RAM memory 113 due to abnormal voltage drop, the error information will be stored in the non-volatile memory 111b.

As is understood from the heretofore descriptions, in the on-vehicle electronic control unit according to this fifth embodiment of the invention, the first block 112a of the mentioned non-volatile memory 111b further contains a program acting as device error detection means 902, error occurrence storage means 904, a fourth transfer save means 9071, 907b, and retransfer save means 908a, 908b. The mentioned device error detection means 902 is means for detecting disconnection and short circuit error of input/output wiring with respect to at least a part of mentioned on-vehicle sensor groups 101 and 102 or on-vehicle current consumer group 103 or a detection characteristic error of sensor, or at least a part of short circuit and open errors of a load drive element. The mentioned error occurrence storage means 904 is means for storing error occurrence information having been detected by the mentioned device error detection means 902 in the mentioned RAM memory 113. The mentioned fourth transfer save means 907a, 907b is means for transferring and saving the error occurrence information having been stored in the RAM memory 113 by the mentioned error occurrence storage means into either one of device error information storage regions provided in the second block 112b and the third block 112c of the mentioned non-volatile memory. The mentioned retransfer save means 908a, 908b is means for writing and saving again an error information having been saved in the other block at the time of batch clear of either the mentioned second block 112b or third block 112c in a device error information storage region of this batch clear block.

As a result, even if there is any voltage drop error of the on-vehicle battery 105, any power supply terminal open at the time of maintenance replacement or the like, the error information having once been stored in the non-volatile memory 111b is exactly saved. In the case where, for example, an exhaust gas sensor in the on-vehicle sensor group 102 falls into an error and this exhaust gas sensor is replaced, error information is read out with the external tool 104 to confirm content of the error; further an entire data in the non-volatile memory 111b are read out to a memory in the external tool 104, and then batch clear of the non-volatile memory 111a is executed; and furthermore semi-fixed control constants, variable control constants or error information having been learned and stored with regard to this exhaust gas sensor are deleted, and then batch transfer and write into the non-volatile memory 111a is executed again, whereby new learning information can be written.

Further, an advantage exists in that, in the case of the on-vehicle sensor groups 101 and 102 or the on-vehicle current consumer group 103 possessing no semi-fixed control constants or variable control constants necessary to be learned and stored, the on-vehicle sensor groups 101 and 102 or the on-vehicle current consumer group 103 being the one of which error occurrence information is merely saved, it is unnecessary to alter a content of the first block 112a at the time of replacement of error occurrence part, and error information in the second block 112b or the third block 112c is only deleted, resulting in an easier maintenance replacement work.

Furthermore, error information to be retransferred between the second block 112b and the third block 112c is retransferred to one of the blocks, and thereafter batch clear of the other block is executed. Consequently, a feature exits in that error information does not disappear despite of abnormal voltage drop of the on-vehicle battery 105.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. An on-vehicle electronic control unit, which is formed of a microprocessor provided with a non-volatile memory in which a control program module and control constants corresponding to an uncontrolled vehicle are stored from an external tool, and a RAM memory for operation processing; the on-vehicle electronic control unit controlling an on-vehicle current consumer group responsive to an input signal from on-vehicle sensor groups and a content of said non-volatile memory, and in which at least a part of said control constants is transferred to said RAM memory and used as a variable control constant to be rewritten and altered as a result of learning operation during operation;

wherein said non-volatile memory employs a flash memory in which data can be written after batch clear in plural blocks of a first block acting as a main block and a second block acting as an auxiliary block;

a control constant processing program module formed of initial transfer write means, first and second transfer save means, update transfer write means and batch clear means, and an initial value data with respect to a semi-fixed control constant and a variable control constant are preliminarily stored from said external tool in the first block of said non-volatile memory, in addition to an input/output control program module, a learning control program module and a fixed control constant, and the semi-fixed control constant is added to and stored in said first block after control operation, and;

a variable control constant is stored in the second block being a block other than said first block;

said initial transfer write means is transfer write means that transfers said initial value data to said RAM memory at the start of control operation, and uses said initial value data as a control constant at the time when learning has not completed yet;

said first transfer save means is means that adds and stores said semi-fixed control constant having been learned and stored during the control operation and written in said RAM memory in a predetermined region of said first block;

said second transfer save means is means that sequentially adds and stores a variable control constant having been learned and stored during the control operation and actual operation and having been sequentially updated and written in said RAM memory while updating an address of said second block;

said update transfer write means are transfer write means that transfer to said RAM memory said semi-fixed control constant having been stored in the first block by said first transfer save means or the latest variable control constant having been stored in the second block by said second transfer save means, and use said semi-fixed control constant having been stored in the first block by said first transfer save means or the latest variable control constant having been stored in the second block by said second transfer save means as a control constant after learning has completed; and said batch clear means is means that executes batch clear before the next addition and write, in the state that an amount of variable control constants having been sequentially added and written in said second block have reached a predetermined value, and that erases an entire data having been written in the second block.

2. The on-vehicle electronic control unit according to claim 1, wherein a third block to be alternately used is employed to act as a further auxiliary block in the second block which is an auxiliary block of said non-volatile memory;

a said control constant processing program module formed of said initial transfer write means, said first and second transfer save means, said update transfer write means and an alternate batch clear means, and said initial value data with respect to said semi-fixed control constant and said variable control constant are preliminarily stored from said external tool in said first block, in addition to an input/output control program module, a learning control program module and said fixed control constant; and further the semi-fixed control constant is added and stored after control operation, and said variable control constant is stored in either the second block or the third block of said non-volatile memory;

said initial transfer write means is transfer write means that transfers said initial value data to said RAM memory at the start of control operation, and uses said initial value data as a control constant at the time when learning has not completed yet;

said first transfer save means is means that adds and stores said semi-fixed control constant having been learned and stored during the control operation and written in said RAM memory in said predetermined region of said first block;

said second transfer save means is means that sequentially adds and stores a variable control constant having been learned and stored during the control operation and actual operation and having been sequentially updated and written in said RAM memory while updating an address of said second block or third block;

said update transfer write means are transfer write means that transfer to said RAM memory said semi-fixed control constant having been stored in the first block by said first transfer save means or the latest variable control constant having been stored in the second block or the third block by said second transfer save means, and uses said semi-fixed control constant having been stored in the first block by said first transfer save means or the latest variable control constant having been stored in the second block or the third block by said second transfer save means as a control constant after learning has completed; and said alternate batch clear means are means that execute alternate batch clear before the next addition and write, in the state that an amount of variable control constants having been sequentially added and written in one of said second block or third block reaches a predetermined value, and that erase an entire data having been written in the other block which is the second block or the third block, and then start sequential addition and write in said second block or third block which has just been erased.

3. The on-vehicle electronic control unit according to claim 1, wherein the control constants to be written in said non-volatile memory are further sorted into program inherent information and control unit inherent information, or vehicle inherent information and learning storage information, and a reference data for error determination with respect to a learning value is stored in the first block of said non-volatile memory;

said program inherent information is a fixed control constant, being an invariable design constant determined in association with said input/output control program module;

said control unit inherent information is calibration value information for compensating fluctuation in characteristics of parts of an output voltage accuracy of a constant voltage power supply, a conversion accuracy of an AD converter contained in the on-vehicle electronic control unit, and is said semi-fixed control constant that is not changed after having been once stored as an initial measured value even though the semi-fixed control constants are different in respective individual products;

said vehicle inherent information is environmental information including vehicle type information for selecting and determining control specification of a vehicle on which the on-vehicle electronic control unit is mounted or characteristic accuracy information of an on-vehicle sensor externally connected to the on-vehicle electronic control unit, and is a control constant that is not changed until the replacement of an externally connected part after having once been stored as an initial value or an initial measured value even though the control constants are different in respective individual vehicles, the vehicle inherent information being processed as the one which belongs to either said variable control constant or said semi-fixed control constant;

said learning storage information is variation information comprising driving control information obtained as a result of actually measuring driving characteristics of a vehicle, or characteristic deterioration information of an on-vehicle sensor and current consumer, and is said variable control constant which varies within a predetermined range after said variable control has been once stored as an initial value at the start of operation; and said reference data includes a permissible variation width with respect to a permitted upper or lower limit value or a representative value relative to said semi-fixed control constant or said variable control constant.

4. The on-vehicle electronic control unit according to claim 3, wherein the control constant processing program module to be stored in said first block further comprises error determination means and first and second transfer means with regard to said update transfer write means;

said error determination means are formed of lack and mix detection means of bit information acting as code check means represented by a sum check or a CRC check with respect to said semi-fixed control constant or said variable control constant stored in each block of said non-volatile memory, and band comparison means for comparing and determining whether or not a content of said semi-fixed control constant or said variable control constant is within a permissible range specified with said reference data;

said first transfer means are said update transfer write means that are selected when said error determination means make a normal determination, and that transfer to and write in said RAM memory a content of said semi-fixed control constant or said variable control constant; and said second transfer means are said update transfer write means that are selected when said error determination means make an error determination, and that transfer to and write in said RAM memory an estimated constant, being an average value or a representative value of said reference data, or an initial value data.

5. The on-vehicle electronic control unit according to claim 4, wherein the control constant processing program module to be stored in said first block further comprises a program module acting as storage determination means with respect to said RAM memory; and said storage determination means are constituted of said lack and mix detection means of bit information with respect to said RAM memory, coincidence determination means for determining coincidence of said variable control constant stored in the non-volatile memory with a content of the RAM memory before rewrite and alternation, or band comparison means with respect to said reference data; and update transfer write is executed into the RAM memory by said first or second transfer means when a content of the RAM memory is determined erroneous by said storage determination means.

6. The on-vehicle electronic control unit according to claim 3, wherein the first and second transfer save means, which are stored in said first block, are further means that act at intervals of a predetermined time period after a power supply switch to be brought in a closed circuit during operation of the on-vehicle electronic control unit, or in a delay period from the interruption of said power supply switch to the interruption of control power supply to the on-vehicle electronic control unit, and that store and save in each block of said non-volatile memory said semi-fixed control constant or said variable control constant stored in said RAM memory.

7. The on-vehicle electronic control unit according to claim 3, wherein said first block further comprises a program module acting as error alarm/display means; and the number of times of batch clear of said variable control constant is stored as a management data in a block of said non-volatile memory on the side in which said variable control constant is written, and said error alarm/display means is means for performing error annunciation when said number of times of batch clear exceeds a predetermined value.

8. The on-vehicle electronic control unit according to claim 3, wherein a management data storage region, in which said variable control constant is written, is provided in a block of said non-volatile memory in which a variable control constant is written; and said management data includes at least an average value or the maximum value and minimum value of a plurality of variable control constants having been stored in sequence before batch clear.

9. The on-vehicle electronic control unit according to claim 3, wherein a compensation data is added to a plurality of semi-fixed control constants or variable control constants to be transferred and written from the RAM memory by said first and second transfer save means; and said compensation data is a compensate data with which a sum value or a remainder value by CRC check with respect to the entire save data including said compensation data is zero, the compensation data being arranged to prevent a sum value or a remainder value of the whole from varying even if a part of data in the non-volatile memory is changed by said first and second transfer save means.

10. The on-vehicle electronic control unit according to claim 4, wherein the first block of said non-volatile memory further comprises a program module acting as error alarm/display means operating responsive to said error determination means; and said error alarm/display means announces that said microprocessor controls an on-vehicle current consumer with said semi-fixed control constant or said variable control constant based on said second transfer means.

11. The on-vehicle electronic control unit according to claim 5, wherein a watchdog timer, an error storage circuit and a drive stop circuit are further connected to said microprocessor, and the first block of said non-volatile memory further comprises a program module acting as system error determination means;

said watchdog timer is a timer circuit generating a reset signal output that causes said microprocessor to temporally reset and restart when a pulse width of a watchdog signal, which said microprocessor generates, is erroneous;

said system error determination means is constituted of said lack and mix detection means of bit information with respect to the whole of said first block or at least a control program module region of the first block;

said error storage circuit is a circuit storing that said system error determination means makes an error determination, and that said watchdog timer generates a reset signal output, and being reset at the time of turning the power supply on; and said drive stop circuit is a circuit that acts when said error operation storage circuit stores an error, and that stops a drive output of a load power supply relay to a part or the whole of said on-vehicle current consumer group.

12. The on-vehicle electronic control unit according to claim 5, wherein a watchdog timer, a count circuit and a drive stop circuit are further connected to said microprocessor, and the first block of said non-volatile memory further comprises a program module acting as system error determination means;

said watchdog timer is a timer circuit generating a reset signal output that causes said microprocessor to temporally reset and restart when a pulse width of a watchdog signal, which said microprocessor generates, is erroneous;

said system error determination means is constituted of lack and mix detection means of bit information with respect to the whole of said first block or at least a control program module region of the first block, and comprises a signal circuit that causes said microprocessor to temporally reset and restart when said system error determination means determines an error;

said count circuit is a count circuit generating a count output when the number of times of reset of the microprocessor by said watchdog timer and said system error determination means exceeds a predetermined value; and being reset at the time of turning the power supply on; and said drive stop circuit is a circuit that acts when said count circuit generates a count output, and that stops a drive output of a load power supply relay to a part or the whole of said on-vehicle current consumer group.

13. The on-vehicle electronic control unit according to claim 11, wherein the first block of said non-volatile memory further comprises a program module acting as error history storage means, and an auxiliary block on the side in which said variable control constant is saved further comprises a history information save region; and said error history storage means is data save means that acts when error occurrence in the non-volatile memory or the RAM memory is detected by any one of said system error determination means, said error determination means or said storage determination means, and that stores error occurrence information in said RAM memory and transfers the error occurrence information of the RAM memory having been stored by said error history storage means to a history information save region of said variable control constant storage side of said auxiliary block at the time of operation of said second transfer save means.

14. The on-vehicle electronic control unit according to claim 13, wherein a management data storage region is provided in an auxiliary block of said non-volatile memory in which said variable control constant is written; and management data contains at least an error history aggregate data obtained by aggregating the number of occurrence of error history having been sequentially stored before batch clear by error code number.

15. The on-vehicle electronic control unit according to claim 12, wherein the first block of said non-volatile memory further comprises a program module acting as error history storage means, and a block on the side in which said variable control constant is saved further comprises a history information save region; and said error history storage means is data save means that acts when error occurrence in the non-volatile memory or the RAM memory is detected by any one of said system error determination means, said error determination means or said storage determination means, and that stores error occurrence information in said RAM memory and transfers the error occurrence information of the RAM memory having been stored by said error history storage means to a history information save region of said auxiliary block at the time of operation of said second transfer save means.

16. The on-vehicle electronic control unit according to claim 15, wherein a management data storage region is provided in a block of said non-volatile memory in which said variable control constant is written; and management data contains at least an error history aggregate data obtained by aggregating the number of occurrence of error history having been sequentially stored before batch clear by error code number.

17. The on-vehicle electronic control unit according to claim 1, wherein the first block of said non-volatile memory further comprises a program module acting as device error detection means, error occurrence storage means, and a third transfer save means;

said device error detection means is means for detecting disconnection and short circuit error of input/output wiring with respect to at least a part of said on-vehicle sensor groups or said on-vehicle current consumer group or a detection characteristic error of sensor, or at least a part of short circuit and open errors of load drive element;

said error occurrence storage means is means for storing in said RAM memory error occurrence information having been detected by said device error detection means; and said third transfer save means is means for transferring to and saving the error occurrence information having been stored in the RAM memory by said error occurrence storage means in a device error information storage region provided in the first block of said non-volatile memory.

18. The on-vehicle electronic control unit according to claim 1, wherein the first block of said non-volatile memory further comprises a program module acting as device error detection means, error occurrence storage means, a fourth transfer save means, and retransfer save means;

said device error detection means is means for detecting disconnection and short circuit error of input/output wiring with respect to at least a part of said on-vehicle sensor groups or said on-vehicle current consumer group or a detection characteristic error of sensor, or at least a part of short circuit and open errors of a load drive element;

said error occurrence storage means is means for storing in said RAM memory error occurrence information having been detected by said device error detection means;

said fourth transfer save means is means for transferring and saving the error occurrence information having been stored in the RAM memory by said error occurrence storage means in a device error information storage region provided in the second block of said non-volatile memory; and said retransfer save means is means for writing and saving again an error information having been saved before batch clear of said second block in a device error information storage region of the second block after batch clear.

19. The on-vehicle electronic control unit according to claim 2, wherein the first block of said non-volatile memory further comprises a program module acting as device error detection means, error occurrence storage means, a fourth transfer save means, and retransfer save means;

said device error detection means is means for detecting disconnection and short circuit error of input/output wiring with respect to at least a part, of said on-vehicle sensor groups or said on-vehicle current consumer group or a detection characteristic error of sensor, or at least a part of short circuit and open errors of a load drive element;

said error occurrence storage means is means for storing in said RAM memory error occurrence information having been detected by said device error detection means;

said fourth transfer save means are means for transferring and saving the error occurrence information having been stored in the RAM memory by said error occurrence storage means in either one of device error information storage regions provided in the second block and the third block of said non-volatile memory; and said retransfer save means are means for writing and saving again an error information having been saved in the other block which is the third block or the second block, at the time of batch clear of either said second block or third block, in a device error information storage region of said batch clear block.

* * * * *